(12) United States Patent
Yohannes et al.

(10) Patent No.: US 11,121,302 B2
(45) Date of Patent: Sep. 14, 2021

(54) SYSTEM AND METHOD FOR SUPERCONDUCTING MULTI-CHIP MODULE

(71) Applicant: SeeQC, Inc., Elmsford, NY (US)

(72) Inventors: Daniel Yohannes, Stamford, CT (US); Denis Amparo, White Plains, NY (US); Oleksandr Chernyashevskyy, White Plains, NY (US); Oleg Mukhanov, Putnam Valley, NY (US); Mario Renzullo, Yonkers, NY (US); Andrei Talalaeskii, Mahopac, NY (US); Igor Vernik, Yorktown Heights, NY (US); John Vivalda, Poughkeepsie, NY (US); Jason Walter, Trumbull, CT (US)

(*) Notice: Subject to any disclaimer, the term of this patent is extended or adjusted under 35 U.S.C. 154(b) by 52 days.

(21) Appl. No.: 16/599,985

(22) Filed: Oct. 11, 2019

(65) Prior Publication Data

US 2020/0119251 A1    Apr. 16, 2020

Related U.S. Application Data

(60) Provisional application No. 62/744,494, filed on Oct. 11, 2018.

(51) Int. Cl.
*H01L 29/06* (2006.01)
*H01L 29/08* (2006.01)
(Continued)

(52) U.S. Cl.
CPC ............ *H01L 39/045* (2013.01); *H01L 24/05* (2013.01); *H01L 24/13* (2013.01); *H01L 24/81* (2013.01); *H01L 39/223* (2013.01); *H01L 39/2493* (2013.01); *H01L 2224/0401* (2013.01); *H01L 2224/05179* (2013.01); *H01L 2224/13083* (2013.01); *H01L 2224/13109* (2013.01); *H01L 2224/13147* (2013.01); *H01L 2224/13166* (2013.01); *H01L 2224/13179* (2013.01); *H01L 2224/8109* (2013.01);
(Continued)

(58) Field of Classification Search
USPC .......................................... 257/31
See application file for complete search history.

(56) References Cited

U.S. PATENT DOCUMENTS

| 4,930,001 A * | 5/1990 | Williams | H01L 24/11 257/737 |
|---|---|---|---|
| 2019/0102469 A1* | 4/2019 | Makovsky | G06F 11/0781 |
| 2019/0229094 A1* | 7/2019 | White | H01L 23/53285 |

* cited by examiner

*Primary Examiner* — Niki H Nguyen
(74) *Attorney, Agent, or Firm* — Hoffberg & Associates; Steven M Hoffberg

(57) ABSTRACT

A method for bonding two superconducting integrated circuits ("chips"), such that the bonds electrically interconnect the chips. A plurality of indium-coated metallic posts may be deposited on each chip. The indium bumps are aligned and compressed with moderate pressure at a temperature at which the indium is deformable but not molten, forming fully superconducting connections between the two chips when the indium is cooled down to the superconducting state. An anti-diffusion layer may be applied below the indium bumps to block reaction with underlying layers. The method is scalable to a large number of small contacts on the wafer scale, and may be used to manufacture a multi-chip module comprising a plurality of chips on a common carrier. Superconducting classical and quantum computers and superconducting sensor arrays may be packaged.

21 Claims, 17 Drawing Sheets

(51) Int. Cl.
*H01L 31/0256* (2006.01)
*H01L 39/22* (2006.01)
*H01L 39/04* (2006.01)
*H01L 23/00* (2006.01)
*H01L 39/24* (2006.01)

(52) U.S. Cl.
CPC .................. *H01L 2224/8112* (2013.01); *H01L 2224/81203* (2013.01); *H01L 2924/0495* (2013.01); *H01L 2924/04941* (2013.01)

SYSTEM AND METHOD FOR SUPERCONDUCTING MULTI-CHIP MODULE

CROSS REFERENCE TO RELATED APPLICATIONS

The present application is a non-provisional of, and claims benefit of priority under 35 U.S.C. § 119(e) of, U.S. Provisional Patent Application No. 62/744,494, filed Oct. 11, 2018, the entirety of which is expressly incorporated herein by reference.

FIELD OF THE INVENTION

The present invention relates to the field of manufacturing of superconducting integrated circuit modules, and packages bonding a plurality of such circuits.

BACKGROUND OF THE INVENTION

All references cited herein are expressly incorporated herein by reference, for all purposes.

The technology of superconducting integrated circuits has been developing in recent years, although the integration scale remains somewhat below that of mainstream semiconductor technology. The most advanced superconducting integrated circuits are based on niobium (Nb) thin films, and Josephson junctions comprising a nanometer-thick aluminum oxide insulating layer between two Nb layers. These circuits function at temperatures below 9 K, and preferably below about 4 K. Large-scale integrated circuits have been fabricated with up to 10,000 Josephson junctions on a single chip, and up to 10 superconducting wiring layers. See, for example, the following US patents, incorporated in their entirety by reference:

Double masking technique for increasing fabrication yield in superconducting electronics (Tolpygo, U.S. Pat. Nos. 9,595,656; 9,136,457; 8,383,426; 7,615,385).

System and Method for Providing Multi-conductive Layer Interconnects for Superconducting Integrated Circuits (Tolpygo, U.S. Pat. Nos. 9,741,920; 9,130,116; 8,301,214)

Method for increasing the integration level of superconducting electronic circuits, and a resulting circuit (Yohannes, U.S. Pat. No. 9,741,918)

Systems and Methods for Fabrication of Superconducting Integrated Circuits (Ladizinsky, U.S. Pat. Nos. 8,951,808; 9,490,296; 9,978,809)

One developing application of superconducting integrated circuits is for classical computing and memory arrays based on rapid-single-flux-quantum (RSFQ) logic and related technologies, as disclosed in the following US Patents, incorporated in their entirety by reference:

System and Method for Cryogenic Hybrid Technology Computing and Memory (Mukhanov, U.S. Pat. Nos. 9,887,000; 9,520,180).

Superconducting Devices with Ferromagnetic Barrier Junctions (Mukhanov, U.S. Pat. Nos. 9,627,045; 8,971,977)

Low Power Biasing Network for Superconducting Integrated Circuits (Mukhanov, U.S. Pat. Nos. 9,853,645; 9,473,124; 9,240,773; 8,571,614).

Magnetic RAM Array Architecture (Ohki, U.S. Pat. Nos. 9,552,862; 9,747,968).

Josephson magnetic random access memory system and method (Herr, U.S. Pat. No. 8,270,209).

See, U.S. Pat. Nos. and Pub. Patent Application Nos. 5,140,324; 5,170,080; 5,198,815; 5,233,242; 5,233,243; 5,256,636; 5,289,400; 5,291,035; 5,327,130; 5,341,136; 5,388,068; 5,389,837; 5,598,105; 5,629,889; 5,781,009; 5,793,055; 5,818,373; 5,936,458; 5,963,351; 5,982,219; 6,023,161; 6,115,789; 6,175,749; 6,188,236; 6,242,939; 6,331,805; 6,345,189; 6,345,190; 6,353,330; 6,388,600; 6,420,895; 6,459,097; 6,479,139; 6,486,694; 6,486,756; 6,507,234; 6,509,853; 6,518,786; 6,526,491; 6,549,059; 6,563,310; 6,573,202; 6,576,951; 6,580,102; 6,608,581; 6,614,047; 6,626,995; 6,630,426; 6,703,857; 6,715,118; 6,724,216; 6,725,248; 6,728,131; 6,734,454; 6,734,699; 6,754,823; 6,756,925; 6,759,974; 6,763,363; 6,773,836; 6,781,435; 6,791,109; 6,797,341; 6,803,599; 6,809,734; 6,812,464; 6,812,484; 6,813,056; 6,822,255; 6,826,662; 6,838,749; 6,865,639; 6,909,109; 6,917,216; 6,917,537; 6,936,841; 6,946,428; 7,002,366; 7,049,593; 7,073,087; 7,078,694; 7,090,889; 7,093,104; 7,095,227; 7,124,259; 7,129,869; 7,129,870; 7,139,882; 7,170,960; 7,227,480; 7,231,500; 7,233,998; 7,236,998; 7,268,713; 7,280,623; 7,304,646; 7,313,199; 7,321,958; 7,360,102; 7,362,125; 7,365,663; 7,386,687; 7,389,508; 7,392,511; 7,395,411; 7,409,570; 7,415,703; 7,428,619; 7,437,536; 7,439,208; 7,440,490; 7,443,719; 7,444,525; 7,444,632; 7,457,939; 7,468,630; 7,475,257; 7,478,390; 7,496,673; 7,496,917; 7,498,832; 7,501,877; 7,502,928; 7,505,310; 7,508,230; 7,509,457; 7,516,334; 7,516,456; 7,523,157; 7,526,608; 7,546,405; 7,549,145; 7,554,369; 7,565,653; 7,570,075; 7,576,782; 7,598,897; 7,613,886; 7,614,053; 7,644,255; 7,653,908; 7,676,683; 7,680,474; 7,680,972; 7,685,601; 7,687,938; 7,689,783; 7,689,784; 7,689,814; 7,693,053; 7,694,306; 7,698,473; 7,701,286; 7,707,385; 7,714,605; 7,719,453; 7,720,982; 7,724,020; 7,724,083; 7,728,748; 7,730,456; 7,733,253; 7,748,006; 7,750,664; 7,768,287; 7,772,871; 7,774,512; 7,782,077; 7,783,584; 7,786,748; 7,786,786; 7,788,467; 7,802,023; 7,814,166; 7,816,940; 7,818,507; 7,818,724; 7,852,106; 7,868,645; 7,876,869; 7,882,310; 7,882,379; 7,886,112; 7,893,708; 7,903,456; 7,911,265; 7,917,667; 7,917,798; 7,921,151; 7,926,023; 7,928,875; 7,944,253; 7,956,640; 7,958,371; 7,969,178; 7,977,668; 7,991,013; 7,991,814; 7,999,813; 8,001,294; 8,001,377; 8,001,390; 8,001,592; 8,010,716; 8,022,012; 8,022,722; 8,028,288; 8,028,292; 8,045,660; 8,050,648; 8,055,235; 8,055,318; 8,091,078; 8,098,179; 8,108,564; 8,130,880; 8,138,784; 8,159,825; 8,176,481; 8,179,133; 8,188,901; 8,208,288; 8,219,981; 8,224,639; 8,247,799; 8,249,540; 8,260,143; 8,260,144; 8,260,145; 8,271,805; 8,290,553; 8,301,104; 8,301,214; 8,321,866; 8,347,165; 8,359,186; 8,362,220; 8,401,509; 8,401,600; 8,416,109; 8,434,091; 8,437,818; 8,462,889; 8,514,986; 8,521,117; 8,547,732; 8,549,521; 8,555,127; 8,565,345; 8,569,874; 8,571,614; 8,582,687; 8,593,141; 8,618,799; 8,629,729; 8,670,807; 8,726,041; 8,744,541; 8,751,212; 8,755,220; 8,769,495; 8,786,476; 8,787,873; 8,804,358; 8,806,316; 8,811,536; 8,861,619; 8,867,931; 8,872,690; 8,923,073; 8,930,786; 8,933,695; 8,937,255; 8,970,217; 8,971,977; 8,977,223; 9,020,079; 9,020,362; 9,058,164; 9,065,452; 9,110,771; 9,130,116; 9,160,593; 9,166,625; 9,183,051; 9,203,654; 9,235,811; 9,240,773; 9,252,825; 9,261,573; 9,276,615; 9,282,645; 9,312,878; 9,312,895; 9,344,069; 9,385,293; 9,401,823; 9,425,804; 9,425,838; 9,443,576; 9,455,391; 9,455,707; 9,473,124; 9,476,950; 9,509,315; 9,514,812; 9,520,180; 9,548,878; 9,552,862; 9,554,303; 9,565,045; 9,577,690; 9,582,695; 9,588,191; 9,614,532; 9,618,591; 9,627,045; 9,641,372; 9,647,194; 9,661,596; 9,686,112; 9,692,423; 9,699,266; 9,703,516; 9,710,586; 9,712,172; 9,722,589; 9,739,851; 9,741,918; 9,741,920; 9,742,429; 9,747,968; 9,748,937; 9,780,765; 9,787,312; 9,793,913; 9,793,933; 9,812,836; 9,818,064; 9,838,051;

9,853,645; 9,887,000; 9,906,191; 9,906,248; 9,982,935; 9,998,122; 20020060635; 20020105948; 20020118903; 20020119805; 20020135582; 20020138637; 20020138701; 20020138707; 20020156993; 20020169079; 20020179937; 20020179939; 20020188578; 20020189533; 20030011398; 20030034794; 20030057441; 20030102470; 20030111659; 20030111661; 20030115401; 20030146429; 20030146430; 20030179831; 20030207767; 20030219911; 20030229765; 20040016883; 20040022332; 20040120299; 20040134967; 20040150458; 20040167036; 20040170047; 20040220057; 20040234785; 20040266627; 20050023518; 20050035368; 20050036055; 20050071404; 20050071513; 20050071526; 20050071578; 20050071651; 20050071828; 20050074220; 20050078022; 20050078117; 20050081181; 20050081182; 20050081201; 20050081202; 20050081203; 20050081209; 20050081213; 20050086655; 20050091473; 20050095011; 20050097231; 20050097280; 20050097302; 20050116204; 20050120185; 20050120187; 20050120254; 20050138325; 20050160097; 20050188372; 20050188373; 20050216222; 20050216775; 20050228967; 20050231196; 20050243708; 20050251659; 20050251667; 20050268038; 20050268048; 20050273652; 20060038821; 20060049891; 20060069879; 20060075397; 20060092957; 20060093861; 20060107122; 20060112213; 20060126770; 20060129786; 20060129999; 20060143509; 20060149861; 20060155792; 20060155955; 20060155964; 20060161741; 20060177122; 20060179179; 20060179198; 20060179255; 20060179275; 20060179277; 20060179278; 20060179436; 20060190614; 20060190942; 20060195824; 20060206731; 20060206732; 20060212643; 20060251070; 20060255987; 20060259733; 20060259743; 20060270173; 20070049097; 20070075729; 20070075752; 20070077906; 20070083870; 20070168538; 20070176625; 20070180041; 20070186077; 20070194958; 20070240013; 20070277000; 20070283103; 20070288701; 20070293160; 20080040805; 20080048762; 20080048902; 20080049885; 20080052504; 20080077721; 20080077815; 20080091886; 20080098260; 20080101444; 20080101501; 20080101503; 20080103708; 20080107213; 20080112313; 20080126601; 20080146449; 20080155203; 20080162834; 20080162877; 20080168443; 20080186064; 20080209156; 20080229143; 20080231353; 20080235679; 20080250414; 20080256275; 20080271003; 20080276232; 20080279370; 20080282063; 20080282084; 20080282093; 20080282341; 20080282342; 20080290938; 20080297230; 20080301695; 20090002014; 20090008632; 20090057652; 20090068355; 20090073017; 20090086533; 20090125717; 20090153381; 20090232191; 20090232507; 20090232510; 20090237106; 20090244958; 20090322374; 20100026537; 20100066576; 20100133514; 20100148841; 20100149011; 20100312969; 20100329401; 20110087909; 20110133770; 20110167241; 20110288823; 20110302591; 20110303153; 20120030386; 20120088674; 20120096873; 20120108434; 20120184445; 20120266174; 20120274494; 20120328301; 20130004180; 20130043945; 20130079230; 20130258595; 20130272453; 20130303379; 20140056385; 20140113828; 20140175380; 20140245314; 20140286465; 20150078290; 20150119253; 20150125155; 20150146805; 20150146806; 20150178432; 20150229343; 20150300719; 20160012882; 20160028402; 20160028403; 20160035404; 20160036612; 20160080189; 20160093420; 20160197628; 20160351306; 20170012862; 20170038123; 20170069367; 20170133577; 20170134091; 20170141769; 20170163301; 20170178018; 20170186935; 20170237594; 20170265158; 20170295048; 20170324019; 20170345990; 20170359072; 20180005887; 20180101785; 20180102469; 20180102470; 20180145664; and 20180248103.

Another developing application of these circuits is for sensor arrays based on SQUIDs and similar devices, such as disclosed in the following US Patents, incorporated in their entirety by reference:

High Linearity Superconducting Magnetic Field Detector (Kornev, U.S. Pat. Nos. 8,933,695; 8,179,133).

2D Arrays of Diamond Shaped Cells Having Multiple Josephson Junctions (Berggren, U.S. Pat. No. 9,664,751).

Linear voltage response of non-uniform arrays of Bi-SQUIDs (Longhini, U.S. Pat. No. 9,097,751).

Magnetic Resonance System and Method Employing a Digital SQUID (Radparvar, U.S. Pat. Nos. 9,618,591; 9,261,573; 8,618,799; 8,593,141).

Yet another application of superconducting integrated circuits that has been developing more recently is quantum computing using quantum bits (or qubits) made of Josephson junctions, as disclosed in the following patents:

System and Method for Controlling Superconducting Quantum Circuits Using Single Flux Quantum Logic Circuits (McDermott, U.S. Pat. No. 9,425,804).

System and Method for Circuit Quantum Electrodynamics Measurement (McDermott, U.S. Pat. No. 9,692,423).

Method and apparatus for controlling qubits with single flux quantum logic (Przybysz, U.S. Pat. No. 7,969,178).

Universal Adiabatic Quantum Computing with Superconducting Qubits (Harris, U.S. Pub. Patent Application No. 2015/0111754).

Superconducting quantum bit device based on Josephson junctions (Esteve, U.S. Pat. No. 6,838,694).

Superconducting shielding for use with an integrated circuit for quantum computing (Bunyk, U.S. Pat. No. 7,687,938).

See, U.S. Pat. Nos. and Pub. Patent Application Nos. 5,917,322; 6,369,404; 6,437,413; 6,459,097; 6,472,681; 6,495,854; 6,504,172; 6,537,847; 6,563,310; 6,563,311; 6,573,202; 6,576,951; 6,580,102; 6,605,822; 6,614,047; 6,627,915; 6,627,916; 6,649,929; 6,670,630; 6,728,131; 6,753,546; 6,784,451; 6,791,109; 6,800,837; 6,803,599; 6,812,484; 6,822,255; 6,838,694; 6,879,012; 6,885,325; 6,897,468; 6,900,454; 6,900,456; 6,905,887; 6,910,382; 6,911,664; 6,919,579; 6,926,921; 6,930,318; 6,930,320; 6,936,841; 6,943,368; 6,960,780; 6,979,836; 6,984,846; 6,987,282; 6,988,058; 7,002,174; 7,015,499; 7,018,852; 7,042,005; 7,069,282; 7,109,593; 7,113,967; 7,122,837; 7,135,697; 7,135,701; 7,145,170; 7,180,087; 7,180,645; 7,184,555; 7,203,715; 7,230,266; 7,249,518; 7,250,624; 7,253,654; 7,268,576; 7,307,275; 7,310,623; 7,312,562; 7,321,884; 7,332,738; 7,334,008; 7,335,909; 7,359,928; 7,364,923; 7,394,092; 7,400,282; 7,402,835; 7,410,763; 7,418,283; 7,426,444; 7,428,562; 7,437,533; 7,443,720; 7,453,162; 7,456,702; 7,460,669; 7,474,010; 7,474,095; 7,479,652; 7,498,832; 7,518,138; 7,525,202; 7,529,717; 7,533,068; 7,547,932; 7,550,759; 7,566,896; 7,579,424; 7,579,699; 7,598,514; 7,605,600; 7,613,764; 7,613,765; 7,619,437; 7,624,088; 7,639,035; 7,687,938; 7,700,710; 7,714,605; 7,724,020; 7,724,083; 7,732,804; 7,749,922; 7,764,568; 7,767,976; 7,772,871; 7,779,228; 7,782,077; 7,786,748; 7,788,192; 7,791,430; 7,800,395; 7,836,007; 7,843,209; 7,844,656; 7,847,615; 7,852,106; 7,858,966; 7,863,892; 7,868,645; 7,870,087; 7,875,876; 7,876,145; 7,876,248; 7,877,333; 7,880,529; 7,889,992; 7,893,708; 7,895,142; 7,898,282; 7,899,852; 7,911,265; 7,912,656; 7,920,598; 7,925,614; 7,932,514; 7,932,515; 7,966,549; 7,969,178; 7,969,805; 7,977,668; 7,982,646; 7,984,012; 7,990,662; 8,008,942; 8,008,991; 8,014,424; 8,018,244; 8,022,703; 8,022,722; 8,032,474; 8,035,540; 8,053,754; 8,058,085; 8,058,638; 8,062,841; 8,063,657; 8,073,631;

8,073,795; 8,073,808; 8,089,286; 8,098,179; 8,102,185; 8,103,172; 8,111,083; 8,117,000; 8,138,756; 8,138,784; 8,138,880; 8,142,754; 8,144,589; 8,148,715; 8,159,313; 8,164,082; 8,169,231; 8,174,305; 8,175,995; 8,184,986; 8,190,548; 8,193,808; 8,195,596; 8,195,726; 8,219,871; 8,222,629; 8,222,899; 8,223,625; 8,228,688; 8,229,863; 8,234,103; 8,242,799; 8,244,650; 8,244,662; 8,247,799; 8,254,079; 8,259,848; 8,271,043; 8,275,428; 8,279,022; 8,283,943; 8,284,585; 8,294,138; 8,301,214; 8,304,758; 8,310,230; 8,315,969; 8,355,765; 8,363,606; 8,374,072; 8,386,554; 8,405,468; 8,421,053; 8,423,297; 8,437,168; 8,437,818; 8,441,329; 8,455,278; 8,457,093; 8,461,862; 8,464,542; 8,477,888; 8,485,427; 8,488,487; 8,494,993; 8,498,639; 8,504,497; 8,507,894; 8,508,280; 8,510,618; 8,513,647; 8,536,566; 8,547,090; 8,553,795; 8,560,282; 8,560,470; 8,571,614; 8,581,227; 8,583,903; 8,604,944; 8,605,288; 8,606,341; 8,611,974; 8,620,835; 8,630,256; 8,631,367; 8,642,998; 8,648,331; 8,654,578; 8,655,828; 8,659,007; 8,669,325; 8,670,777; 8,670,807; 8,675,768; 8,676,223; 8,686,751; 8,687,489; 8,700,689; 8,712,424; 8,735,326; 8,738,105; 8,744,075; 8,745,850; 8,748,196; 8,748,950; 8,772,759; 8,781,129; 8,786,476; 8,812,066; 8,816,325; 8,824,601; 8,830,818; 8,841,764; 8,849,580; 8,854,074; 8,861,619; 8,865,537; 8,872,360; 8,874,629; 8,891,489; 8,892,857; 8,897,057; 8,921,473; 8,922,239; 8,923,073; 8,928,391; 8,947,080; 8,951,808; 8,954,125; 8,972,921; 8,975,912; 8,977,576; 8,983,303; 8,995,797; 9,015,215; 9,026,574; 9,040,959; 9,041,427; 9,059,305; 9,059,674; 9,059,707; 9,069,928; 9,094,969; 9,111,230; 9,129,224; 9,130,116; 9,130,598; 9,134,047; 9,143,266; 9,152,923; 9,152,924; 9,159,033; 9,162,881; 9,170,278; 9,177,814; 9,178,154; 9,183,508; 9,192,085; 9,203,466; 9,207,672; 9,208,446; 9,218,567; 9,218,571; 9,219,298; 9,219,605; 9,224,783; 9,231,181; 9,235,811; 9,240,773; 9,256,834; 9,260,289; 9,270,071; 9,270,385; 9,296,609; 9,306,739; 9,331,020; 9,332,475; 9,335,385; 9,344,092; 9,350,460; 9,354,039; 9,355,362; 9,355,364; 9,355,365; 9,361,169; 9,363,766; 9,363,790; 9,367,288; 9,369,133; 9,379,303; 9,384,827; 9,385,293; 9,385,294; 9,396,440; 9,397,283; 9,400,499; 9,401,766; 9,405,876; 9,406,026; 9,420,603; 9,424,526; 9,425,377; 9,425,804; 9,432,024; 9,437,800; 9,438,245; 9,438,246; 9,443,200; 9,444,430; 9,454,061; 9,455,391; 9,455,392; 9,460,397; 9,461,588; 9,471,279; 9,471,280; 9,471,880; 9,473,124; 9,477,796; 9,489,634; 9,490,296; 9,495,644; 9,501,747; 9,501,748; 9,503,063; 9,509,274; 9,509,280; 9,509,478; 9,514,812; 9,515,247; 9,518,336; 9,520,180; 9,520,547; 9,524,470; 9,530,535; 9,530,873; 9,531,055; 9,537,953; 9,547,826; 9,548,742; 9,559,284; 9,564,573; 9,588,940; 9,589,236; 9,594,726; 9,595,969; 9,607,270; 9,613,905; 9,614,270; 9,614,532; 9,622,188; 9,633,314; 9,634,224; 9,634,835; 9,646,259; 9,647,662; 9,660,859; 9,663,358; 9,664,562; 9,665,539; 9,680,452; 9,683,766; 9,685,935; 9,691,962; 9,692,423; 9,692,595; 9,697,473; 9,699,266; 9,705,063; 9,710,758; 9,713,199; 9,716,219; 9,720,055; 9,721,209; 9,727,527; 9,727,823; 9,727,824; 9,729,152; 9,733,327; 9,735,776; 9,741,918; 9,741,920; 9,741,921; 9,748,976; 9,749,893; 9,753,102; 9,754,214; 9,755,133; 9,761,305; 9,762,200; 9,767,238; 9,768,371; 9,768,771; 9,773,208; 9,779,359; 9,779,360; 9,780,764; 9,780,765; 9,786,194; 9,787,278; 9,787,312; 9,791,258; 9,793,913; 9,798,083; 9,798,219; 9,799,817; 9,800,399; 9,806,711; 9,812,836; 9,817,081; 9,818,064; 9,818,796; 9,823,313; 9,823,314; 9,823,381; 9,824,597; 9,829,545; 9,835,693; 9,835,694; 9,836,699; 9,841484; 9,843,312; 9,845,153; 9,847,121; 9,853,645; 9,853,837; 9,857,509; 9,857,609; 9,858,531; 9,858532; 9,865,648; 9,870,273; 9,870,277; 9,870,536; 9,875,215; 9,875,444; 9,880,365; 9,881,256; 9,882112; 9,885,888; 9,887,000; 9,891,297; 9,892,365; 9,893,262; 9,909,460; 9,910,104; 9,910,105; 9,913414; 9,917,580; 9,922,289; 9,923,538; 9,927,636; 9,928,948; 9,929,334; 9,929,978; 9,934,468; 9,935252; 9,940,212; 9,940,586; 9,941,459; 9,945,917; 9,946,973; 9,947,856; 9,947,861; 9,948,050; 9,948254; 9,952,830; 9,953,268; 9,953,269; 9,966,720; 9,966,926; 9,971,970; 9,978,020; 9,978,809; 9,979400; 9,983,336; 9,984,333; 9,985,193; 9,985,614; 9,991,864; 9,994,956; 9,996,801; 9,998,122; RE44097; 20010020701; 20010023943; 20020097874; 20020117656; 20020117738; 20020121636; 20020130313; 20020130315; 20020177529; 20020179937; 20020179939; 20020180006; 20020188578; 20030005010; 20030021518; 20030023651; 20030027724; 20030038285; 20030042481; 20030057441; 20030068832; 20030071258; 20030094606; 20030098455; 20030102470; 20030107033; 20030111659; 20030111661; 20030121028; 20030146429; 20030146430; 20030164490; 20030169041; 20030173498; 20030173997; 20030193097; 20030207766; 20030224944; 20040000666; 20040012407; 20040016918; 20040077503; 20040095803; 20040098443; 20040119061; 20040135139; 20040140537; 20040165454; 20040167036; 20040170047; 20040173787; 20040173792; 20040173793; 20040238813; 20050001209; 20050045872; 20050062072; 20050082519; 20050098773; 20050101489; 20050107262; 20050123674; 20050131746; 20050133780; 20050143791; 20050162302; 20050167772; 20050184284; 20050184285; 20050197254; 20050224784; 20050250651; 20050256007; 20050273306; 20060022190; 20060033096; 20060033097; 20060043423; 20060045269; 20060091375; 20060097746; 20060097747; 20060115086; 20060123363; 20060147154; 20060151775; 20060157713; 20060179029; 20060225165; 20060248618; 20060260016; 20070048746; 20070063700; 20070073038; 20070080341; 20070135676; 20070162407; 20070170952; 20070174227; 20070180586; 20070194225; 20070215862; 20070239366; 20070241747; 20070250280; 20070258329; 20070263432; 20070287015; 20070295954; 20080052055; 20080065573; 20080086438; 20080089282; 20080095110; 20080109500; 20080116448; 20080116449; 20080117833; 20080120259; 20080123520; 20080129328; 20080132281; 20080162613; 20080176750; 20080185576; 20080186918; 20080214198; 20080215850; 20080218519; 20080224726; 20080225823; 20080227624; 20080233967; 20080238531; 20080258753; 20080258849; 20080260257; 20080262989; 20080274898; 20080284545; 20080291945; 20080297230; 20080310324; 20080313114; 20080313430; 20090003282; 20090005260; 20090008632; 20090010090; 20090014714; 20090015317; 20090028112; 20090033369; 20090042511; 20090046573; 20090057652; 20090070402; 20090075825; 20090077001; 20090078931; 20090078932; 20090082209; 20090085694; 20090086713; 20090087084; 20090097650; 20090097652; 20090102580; 20090121215; 20090122508; 20090135944; 20090167342; 20090168286; 20090173936; 20090177603; 20090182542; 20090192041; 20090206871; 20090214169; 20090220082; 20090241013; 20090259905; 20090261319; 20090265112; 20090278046; 20090289638; 20090299947; 20090316842; 20090317089; 20090319757; 20090321720; 20090322374; 20100026447; 20100027486; 20100057653; 20100062144; 20100085678; 20100085827; 20100094796; 20100105406; 20100109638; 20100133514; 20100148853; 20100157310; 20100157552; 20100182039; 20100194466; 20100224912; 20100241780; 20100264921; 20100270534; 20100281885; 20100296591; 20100303188; 20100306142; 20100315079; 20110009274; 20110010412; 20110018612; 20110022340; 20110022820; 20110031994; 20110047201; 20110049475; 20110054876; 20110055520; 20110057169; 20110060710

20110060711; 20110060780; 20110065585; 20110065586; 20110074403; 20110089405; 20110121895; 20110133770; 20110142242; 20110152104; 20110156008; 20110161638; 20110175061; 20110175062; 20110231462; 20110238607; 20110249548; 20110253906; 20110287941; 20110287944; 20110298489; 20120005456; 20120023053; 20120028806; 20120045136; 20120058602; 20120071333; 20120072191; 20120075682; 20120083302; 20120091193; 20120094838; 20120112168; 20120123693; 20120124432; 20120135867; 20120144159; 20120149581; 20120159272; 20120172233; 20120187378; 20120210111; 20120212375; 20120213371; 20120215821; 20120254586; 20120258861; 20120265718; 20120278057; 20120319085; 20120319684; 20120320668; 20120326130; 20120326720; 20120328290; 20130005580; 20130007087; 20130009677; 20130016835; 20130029848; 20130036078; 20130039236; 20130043945; 20130048950; 20130087766; 20130107617; 20130117200; 20130119351; 20130136112; 20130144925; 20130168233; 20130190185; 20130196855; 20130231249; 20130246495; 20130250926; 20130251145; 20130258595; 20130258869; 20130278283; 20130279617; 20130282636; 20130299783; 20130308956; 20130313526; 20130322873; 20140025606; 20140050475; 20140097405; 20140113828; 20140119537; 20140167811; 20140167836; 20140187427; 20140203838; 20140214257; 20140221059; 20140223224; 20140228222; 20140229705; 20140229722; 20140235450; 20140245249; 20140246652; 20140246763; 20140250288; 20140264283; 20140264284; 20140264285; 20140264286; 20140264287; 20140266496; 20140274725; 20140279822; 20140289583; 20140295907; 20140314419; 20140315723; 20140324933; 20140329687; 20140337612; 20140344322; 20140354326; 20140355998; 20140357493; 20140368234; 20150006443; 20150024964; 20150028970; 20150032991; 20150032993; 20150032994; 20150036967; 20150046681; 20150055630; 20150055961; 20150060756; 20150097159; 20150111754; 20150119252; 20150119253; 20150125829; 20150129089; 20150155468; 20150161524; 20150179436; 20150179914; 20150179915; 20150186791; 20150187840; 20150193692; 20150199178; 20150200778; 20150205759; 20150236235; 20150241481; 20150242758; 20150254571; 20150260812; 20150262072; 20150262073; 20150263260; 20150263736; 20150269124; 20150288500; 20150299894; 20150310350; 20150311422; 20150324705; 20150325774; 20150332163; 20150332164; 20150339417; 20150340584; 20150346291; 20150349780; 20150354938; 20150357550; 20150357783; 20150358022; 20150363707; 20150363708; 20150372217; 20150379418; 20160012346; 20160012347; 20160019468; 20160026183; 20160035470; 20160040288; 20160042294; 20160055421; 20160065693; 20160071021; 20160079968; 20160085616; 20160087598; 20160087599; 20160093420; 20160093790; 20160104073; 20160112031; 20160125309; 20160125310; 20160132785; 20160148112; 20160156356; 20160156357; 20160161411; 20160191060; 20160204330; 20160204331; 20160210560; 20160211438; 20160221825; 20160233860; 20160233965; 20160245639; 20160254434; 20160266220; 20160267032; 20160276570; 20160283197; 20160283857; 20160292586; 20160292587; 20160300155; 20160308502; 20160314407; 20160321559; 20160322693; 20160328208; 20160328659; 20160329896; 20160335558; 20160335559; 20160335560; 20160343932; 20160343934; 20160343935; 20160344414; 20160352515; 20160364653; 20160371227; 20160380026; 20160380636; 20170005255; 20170011305; 20170017742; 20170017894; 20170018312; 20170033273; 20170039481; 20170061317; 20170062107; 20170062228; 20170062692; 20170062898; 20170069819; 20170071082; 20170072504; 20170076787; 20170077380; 20170077381; 20170077382; 20170077383; 20170077665; 20170084813; 20170085231; 20170089961; 20170090080; 20170091646; 20170091647; 20170091648; 20170091649; 20170091650; 20170092833; 20170092834; 20170093015; 20170093381; 20170094544; 20170098682; 20170104546; 20170104695; 20170109605; 20170116159; 20170116542; 20170123171; 20170132524; 20170133336; 20170133576; 20170138851; 20170140296; 20170141285; 20170141286; 20170141287; 20170147303; 20170148972; 20170160474; 20170162778; 20170167977; 20170170812; 20170170813; 20170170893; 20170177534; 20170177751; 20170178017; 20170178018; 20170179973; 20170186934; 20170193388; 20170199036; 20170201222; 20170201224; 20170206461; 20170212405; 20170212860; 20170213143; 20170214410; 20170220510; 20170222116; 20170223094; 20170223143; 20170227795; 20170228483; 20170229167; 20170229631; 20170229632; 20170229633; 20170230050; 20170237144; 20170248832; 20170255629; 20170255871; 20170255872; 20170256698; 20170257074; 20170261770; 20170261771; 20170262765; 20170264373; 20170270245; 20170286858; 20170286859; 20170293854; 20170300454; 20170300808; 20170300817; 20170300827; 20170308644; 20170308804; 20170316713; 20170317203; 20170317262; 20170323195; 20170323206; 20170329883; 20170330101; 20170337155; 20170344898; 20170345990; 20170350929; 20170351967; 20170351974; 20170357539; 20170357561; 20170359072; 20170364362; 20170370019; 20170372412; 20170372427; 20170373044; 20170373153; 20170373369; 20170373658; 20180003753; 20180005809; 20180011981; 20180012932; 20180013052; 20180013426; 20180026633; 20180032893; 20180032894; 20180033944; 20180040800; 20180040935; 20180046933; 20180052806; 20180053112; 20180053113; 20180053551; 20180053809; 20180054201; 20180067182; 20180069288; 20180075365; 20180075901; 20180090200; 20180091115; 20180091141; 20180091142; 20180091143; 20180091244; 20180091440; 20180096085; 20180096257; 20180101784; 20180101785; 20180101786; 20180101787; 20180102469; 20180102470; 20180107092; 20180107526; 20180107938; 20180107939; 20180109379; 20180113373; 20180114138; 20180121601; 20180123597; 20180128739; 20180137428; 20180137429; 20180137430; 20180138987; 20180144262; 20180145631; 20180150760; 20180152294; 20180157775; 20180165601; 20180174852; 20180181685; 20180189444; 20180196780; 20180196916; 20180197102; 20180198427; 20180211158; 20180218279; 20180218280; 20180218281; 20180219150; 20180225186; 20180225586; 20180226451; 20180231868; 20180232258; 20180232652; 20180232653; 20180232654; 20180232655; 20180238869; 20180239928; 20180240032; 20180240033; 20180240034; 20180240035; 20180241552; 20180246848; 20180247200; 20180247217; 20180247236; 20180247974; 20180248104; 20180248894; 20180253552; 20180253599; 20180254895; 20180255000; 20180255073; 20180259597; 20180260245; 20180260729; 20180260730; 20180260731; 20180260732; 20180261752; and 20180262276; 20180262489.

All of these superconducting systems, both classical and quantum, require careful packaging, particularly as the scale of the system increases, and cannot generally be disposed on, or confined to, a single integrated circuit device ("chip"). Furthermore, one might have different cryogenic chips optimized for different system applications, such as a quantum computing chip and a digital control chip, which must be closely interfaced during operation. These include flip-chip configurations and multi-chip modules.

There are several special requirements for bonding superconducting circuits. First, the voltage levels in superconducting circuits are very low, so that all contact resistances must be extremely low. Indeed, for some applications such as quantum computing, the contacts must be fully superconducting at the operating temperature. Second, a Josephson junction generally comprises an ultrathin tunnel barrier approximately 1nm thick, which is very sensitive to diffusion at elevated temperatures, e.g., of impurities or volatile components in adjacent layers. Indeed, the superconducting critical current $I_c$ at the operating temperature of a Josephson junction may be permanently shifted if the processing temperature is raised above about 150° C. for an extended period of time. This has long been known by some in the prior art, but perhaps not widely appreciated, or avoided during fabrication or processing. And third, superconducting circuits are fabricated close to room temperature, but operate at deep cryogenic temperatures around 4 K or below, and all contacts and packaging must withstand thermal cycling, ideally for multiple thermal cycles between 300 K and 4 K, without degradation of contacts mechanically or electrically. Thus, brittle materials with mismatched coefficients of thermal expansion should be avoided.

Several distinct approaches to boding superconducting circuit modules have been developed, with varying degrees of reliability, scalability, and optimization to superconducting circuits. See the following US Patents, incorporated in their entirety by reference:

Superconductive Multi-Chip Module for High Speed Digital Circuits (Dotsenko, U.S. Pat. No. 9,647,194).

Method for Fabrication of Electrical Contacts to Superconducting Circuits (Dotsenko, U.S. Pat. No. 8,159,825).

Method of Forming an Electronic Multichip Module (Dotsenko, U.S. Pat. No. 8,804,358).

Systems and Methods for Testing and Packaging a Superconducting Chip (Bunyk, U.S. Pat. No. 9,865,648).

Interconnect structures for assembly of semiconductor structures including superconducting integrated circuits (Oliver, U.S. Pub. Patent Application No. 2018/0012932).

Cryogenic electronic packages and methods for fabricating cryogenic electronic packages, (Das, U.S. Pub. Patent Application No. 2018/0102469).

Cryogenic electronic packages and assemblies (Das, U.S. Pub. Patent Application No. 2018/0102470).

Modular array of vertically integrated superconducting qubit devices for scaling quantum computing (Chow, U.S. Pat. No. 9,524,470).

There are also several recent articles in the non-patent literature that bear upon packaging of superconducting circuits. Note in particular the following:

Foxen, et al, "Qubit compatible superconducting interconnects", Quantum Science and Technology, vol. 3, no. 1, November 2017, available online at iopscience.iop.org/article/10.1088/2058-9565/aa94fc/meta, which discloses the use of pressed indium (In) bumps to form a cold weld at room temperature without heating. The indium bumps are partially compressed, without the use of any posts. It also discloses using a diffusion barrier layer of titanium nitride (TiN) between indium and superconducting aluminum.

McRae et al, "Thermocompression bonding technology for multilayer superconducting quantum circuits", Applied Physics Letters, vol. 111, 123501, September 2017. Available online at arxiv.org/pdf/1705.02435.pdf, which also discloses indium bump bonds, but here the bonds are heated to 190° C., above the melting temperature of the indium, for 100 minutes.

Reviewing the key aspects of this prior art in packaging of superconducting circuits, Dotsenko (U.S. Pat. Nos. 9,647,194; 8,159,825; 8,804,358) uses epoxy bonding, but contacts do not exhibit zero resistance, and repeated thermal cycling may degrade the quality of the contacts.

Bunyk (U.S. Pat. No. 9,865,648) discloses using metallic pillars and solder bumps, but does not address the issue of avoiding high temperatures in processing, and teaches the use of solder reflow based on lead-tin (Pb/Sn) solder, which would require temperatures of at least 190° C. Such a temperature should be avoided, to avoid changing the properties of the Josephson junctions.

Oliver (U.S. Pub. Patent Application No. 2018/0012932) and Das (U.S. Pub. Patent Application Nos. 2018/0102469; 2018/0102469) also teach the use of solder bumps with an underbump metal, using solder reflow. While a variety of solder compositions are disclosed, no specific processing temperatures are given, and there is no teaching of avoidance of high temperatures due to the sensitivity of Josephson junctions.

Chow (U.S. Pat. No. 9,524,470) discloses superconducting quantum computing components using spring-loading and clamps, as well as wire bonds, which do not correspond to a robust scalable technology.

There have also been earlier patents on indium bump bonding, not focused on superconducting circuits—see, for example, the following U.S. Patents, incorporated in their entirety by reference:

Reworkable Microelectronic Multichip Module (Yokoyama, U.S. Pat. No. 5,920,464). Yokoyama discloses cold-welding indium alloys of different compositions, in such a way that the weld breaks in a predictable manner, enabling rework.

Alloy Bonded Indium Bumps and Methods of Processing Same (Williams U.S. Pat. No. 4,930,001). Williams discloses cold welding at room temperature or up to 100° C., using indium bumps against gold layers. Interdiffusion of indium and gold creates the bond.

Indium alloy cold weld bumps (Helber, U.S. Pat. No. 5,186,379). Helber discloses welding an indium bump with an alloying material at an elevated temperature of about 150° C., just below the melting temperature of indium (157° C.), but above that of a mixed alloy, so that the two materials interdiffuse.

See also: U.S. Pat. Nos. and Pub. Patent Application Nos. 4,039,833; 4,354,109; 4,447,291; 4,479,139; 4,551,629; 4,573,627; 4,614,960; 4,672,737; 4,706,166; 4,718,028; 4,740,700; 4,782,028; 4,803,363; 4,804,132; 4,807,000; 4,817,850; 4,833,515; 4,845,540; 4,865,245; 4,868,902; 4,905,265; 4,910,154; 4,912,545; 4,929,913; 4,930,001; 4,935,627; 4,956,695; 4,964,701; 4,965,649; 4,980,555; 4,998,688; 4,999,486; 5,001,532; 5,015,858; 5,021,854; 5,043,582; 5,045,681; 5,070,241; 5,075,201; 5,075,553; 5,091,288; 5,092,036; 5,111,050; 5,113,076; 5,120,960; 5,128,534; 5,132,763; 5,141,334; 5,146,302; 5,149,671; 5,149,954; 5,168,338; 5,185,613; 5,186,379; 5,201,582; 5,227,656; 5,235,176; 5,236,871; 5,245,191; 5,264,699; 5,269,453; 5,279,974; 5,290,423; 5,293,036; 5,294,789; 5,296,384; 5,300,777; 5,304,500; 5,306,386; 5,308,980; 5,311,010; 5,322,816; 5,327,005; 5,336,879; 5,340,984; 5,347,086; 5,365,088; 5,376,558; 5,376,793; 5,379,336; 5,380,669; 5,381,784; 5,382,542; 5,382,977; 5,384,267; 5,386,128; 5,389,792; 5,391,868; 5,393,696; 5,399,206; 5,401,986; 5,404,006; 5,406,701; 5,414,294; 5,426,072; 5,426,303; 5,426,304; 5,432,374; 5,436,450; 5,440,130; 5,444,280; 5,446,529; 5,449,908; 5,449,944; 5,457,318; 5,475,224; 5,477,173; 5,483,088; 5,485,010; 5,488,504; 5,489,776; 5,494,483; 5,495,114; 5,502,300; 5,512,750; 5,519,529; 5,523,570; 5,523,628; 5,525,867; 5,539,206; 5,541,914; 5,543,641; 5,559,332; 5,559,336; 5,561,593; 5,567,942; 5,567,975; 5,568,574; 5,572,029; 5,574,282; 5,578,826; 5,581,084; 5,582,485; 5,591,678; 5,604,977;

5,608,208; 5,621,227; 5,627,112; 5,629,524; 5,633,203; 5,646,426; 5,652,150; 5,661,267; 5,661,590; 5,672,545; 5,696,577; 5,701,010; 5,708,269; 5,721,429; 5,731,621; 5,732,706; 5,734,156; 5,742,060; 5,742,089; 5,751,049; 5,754,009; 5,773,831; 5,786,597; 5,794,331; 5,801,681; 5,808,329; 5,811,808; 5,825,033; 5,827,771; 5,832,599; 5,847,396; 5,880,010; 5,880,510; 5,900,630; 5,900,799; 5,904,495; 5,912,942; 5,930,330; 5,936,268; 5,949,081; 5,952,646; 5,959,339; 5,965,899; 5,985,692; 6,045,614; 6,054,718; 6,057,552; 6,068,818; 6,069,935; 6,080,984; 6,091,070; 6,104,046; 6,107,619; 6,121,618; 6,133,989; 6,157,042; 6,159,149; 6,166,370; 6,166,438; 6,172,362; 6,175,611; 6,184,538; 6,194,715; 6,194,726; 6,198,101; 6,211,529; 6,216,941; 6,225,059; 6,254,827; 6,255,643; 6,315,953; 6,320,177; 6,325,757; 6,328,421; 6,331,274; 6,335,622; 6,342,700; 6,346,700; 6,355,939; 6,393,327; 6,410,917; 6,417,514; 6,450,615; 6,455,908; 6,465,344; 6,501,092; 6,525,387; 6,531,700; 6,538,445; 6,540,961; 6,541,763; 6,545,289; 6,550,665; 6,552,343; 6,555,890; 6,566,679; 6,621,097; 6,630,735; 6,642,537; 6,647,297; 6,657,194; 6,689,628; 6,727,702; 6,734,452; 6,740,864; 6,743,657; 6,777,312; 6,803,557; 6,819,463; 6,821,729; 6,852,976; 6,864,552; 6,875,975; 6,885,002; 6,897,447; 6,926,190; 6,927,383; 6,930,319; 6,949,748; 6,967,345; 6,970,745; 7,001,794; 7,015,715; 7,052,927; 7,054,410; 7,095,028; 7,129,104; 7,129,489; 7,135,698; 7,145,721; 7,164,702; 7,180,066; 7,180,579; 7,190,165; 7,206,062; 7,217,926; 7,217,982; 7,218,184; 7,223,981; 7,241,419; 7,268,081; 7,333,181; 7,339,246; 7,351,972; 7,408,572; 7,425,308; 7,436,494; 7,453,129; 7,465,661; 7,468,504; 7,474,005; 7,492,399; 7,511,753; 7,512,297; 7,521,224; 7,531,809; 7,532,242; 7,541,584; 7,544,532; 7,551,059; 7,579,594; 7,586,074; 7,589,326; 7,592,593; 7,605,050; 7,608,824; 7,608,906; 7,626,460; 7,634,061; 7,652,252; 7,671,341; 7,723,815; 7,755,023; 7,777,186; 7,795,640; 7,795,650; 7,800,067; 7,808,528; 7,811,855; 7,820,971; 7,858,034; 7,863,741; 7,868,665; 7,919,762; 7,928,473; 7,972,885; 7,973,377; 7,999,869; 8,004,012; 8,009,420; 8,021,914; 8,022,349; 8,030,925; 8,035,184; 8,044,435; 8,097,857; 8,097,904; 8,107,777; 8,115,152; 8,120,683; 8,125,367; 8,143,687; 8,154,099; 8,163,094; 8,163,644; 8,179,296; 8,198,576; 8,243,876; 8,283,632; 8,296,940; 8,314,446; 8,343,807; 8,362,520; 8,399,910; 8,421,015; 8,441,089; 8,456,004; 8,471,204; 8,491,190; 8,514,284; 8,530,264; 8,547,170; 8,552,479; 8,552,480; 8,567,658; 8,586,936; 8,592,301; 8,610,171; 8,624,968; 8,629,726; 8,637,824; 8,653,461; 8,659,664; 8,664,739; 8,692,176; 8,709,949; 8,759,873; 8,772,729; 8,780,418; 8,780,420; 8,816,268; 8,829,452; 8,835,851; 8,847,202; 8,847,409; 8,872,159; 8,900,986; 8,933,832; 8,946,638; 8,969,851; 8,970,706; 9,020,095; 9,024,359; 9,029,259; 9,029,833; 9,054,247; 9,064,992; 9,069,080; 9,105,548; 9,106,056; 9,110,169; 9,121,953; 9,123,607; 9,134,439; 9,142,585; 9,146,157; 9,184,194; 9,190,377; 9,225,920; 9,276,030; 9,276,161; 9,277,204; 9,294,690; 9,318,517; 9,324,745; 9,349,889; 9,385,738; 9,420,264; 9,426,397; 9,453,914; 9,491,389; 9,525,831; 9,530,820; 9,537,027; 9,549,158; 9,575,184; 9,593,907; 9,596,421; 9,613,924; 9,613,999; 9,618,648; 9,627,563; 9,635,284; 9,640,680; 9,664,562; 9,685,477; 9,698,134; 9,712,771; 9,716,085; 9,723,233; 9,743,024; 9,746,376; 9,748,214; 9,761,751; 9,774,795; 9,780,240; 9,797,995; 9,834,209; 9,843,741; 9,847,441; 9,866,773; 9,911,774; 9,923,013; 9,935,138; 9,935,151; RE36315; RE40249; RE43722; 20010025928; 20010026778; 20010026935; 20010029061; 20020001015; 20020008191; 20020011640; 20020011642; 20020028503; 20020106867; 20020111655; 20020125472; 20020135373; 20020135869; 20020144548; 20020146919; 20020148957; 20020161417; 20020179921; 20030000454; 20030015737; 20030020075; 20030102432; 20030160172; 20030178474; 20030183855; 20030194054; 20030199113; 20030205704; 20040008397; 20040016872; 20040017224; 20040021466; 20040031968; 20040061056; 20040063322; 20040095492; 20040106966; 20040108461; 20040108564; 20040124431; 20040142504; 20040144927; 20040169753; 20040172100; 20040188596; 20040189328; 20040195516; 20040195640; 20040228436; 20040240257; 20040241965; 20050044054; 20050045910; 20050070018; 20050082488; 20050116260; 20050167606; 20050189943; 20050205954; 20050255631; 20050261135; 20050263888; 20060038128; 20060056759; 20060108528; 20060118721; 20060118722; 20060181627; 20060232674; 20060232760; 20070001119; 20070012948; 20070025504; 20070052947; 20070075224; 20070075888; 20070131868; 20070197022; 20070209437; 20070210244; 20070224722; 20070235656; 20070235758; 20080019872; 20080032895; 20080079704; 20080089637; 20080090319; 20080111152; 20080135757; 20080231719; 20080277784; 20090001278; 20090004760; 20090050786; 20090051796; 20090072284; 20090078872; 20090079956; 20090101919; 20090108942; 20090109582; 20090121307; 20090122173; 20090197883; 20090244342; 20090256231; 20090290680; 20090321642; 20100025588; 20100035052; 20100038539; 20100101840; 20100116999; 20100140732; 20100226495; 20100246754; 20100295095; 20100295141; 20110011531; 20110032130; 20110042772; 20110079894; 20110084212; 20110101483; 20110114705; 20110147707; 20110147877; 20110156097; 20110169117; 20110169160; 20110176577; 20110198719; 20110215222; 20110218432; 20110221024; 20110221025; 20110233394; 20110233709; 20110248316; 20110253430; 20110261191; 20110272589; 20110315429; 20120001288; 20120028401; 20120043637; 20120068225; 20120068295; 20120138774; 20120161001; 20120161314; 20120187297; 20120205541; 20120262322; 20120273951; 20120285923; 20120306039; 20130000963; 20130028372; 20130044248; 20130076910; 20130082241; 20130107243; 20130126746; 20130153856; 20130175430; 20130187028; 20130193308; 20130214373; 20130244417; 20130250272; 20130250273; 20130270329; 20130273730; 20130341594; 20140061472; 20140061838; 20140061911; 20140063306; 20140091218; 20140102594; 20140160278; 20140173926; 20140175286; 20140197303; 20140217297; 20140225214; 20140263955; 20140267852; 20140291479; 20140312303; 20140340487; 20140350836; 20140367824; 20150115132; 20150123831; 20150136954; 20150136955; 20150163419; 20150202939; 20150243825; 20150258990; 20150280035; 20150287870; 20150301180; 20150319391; 20150331113; 20150355369; 20150364515; 20160003946; 20160043268; 20160087001; 20160104696; 20160142657; 20160148965; 20160150165; 20160155892; 20160181458; 20160195616; 20160218139; 20160220814; 20160231083; 20160255284; 20160266242; 20160295151; 20160307956; 20160341818; 20160344965; 20160372443; 20170006236; 20170010223; 20170025453; 20170026603; 20170033253; 20170040368; 20170041571; 20170062400; 20170069780; 20170077329; 20170084764; 20170084773; 20170133336; 20170179185; 20170179327; 20170211200; 20170250209; 20170299763; 20170330986; 20170372602; 20170373044; 20180013022; 20180013052; 20180019269; 20180024232; 20180024254; 20180035067; 20180056993; 20180067075; 20180094980; 20180114713; 20180122851; 20180132393; 20180132394; 20180132395; 20180132396; 20180132397; 20180132398; 20180132399; 20180151764; 20180160059; 20180160068; 20180175230; 20180175476; 20180190705; 20180198016; 20180212091; 20180247974; and 20180254369.

What is needed is a method to bond superconducting integrated circuits that is mechanically and electrically reliable, avoids damage to superconducting devices, and is scalable to large arrays of small contacts. Furthermore, a method that maintains fully superconducting contacts between superconducting circuits may be essential for quantum computing systems. A method with all of these characteristics does not seem to be present in the prior art.

SUMMARY OF THE INVENTION

The invention provides a method for manufacturing an array of superconducting bonds between superconducting circuits on different chips, such that the operating system of the superconducting circuits can comprise a plurality of chips in an extended three-dimensional package or multi-chip module (MCM).

In a preferred embodiment, the superconducting circuits comprise niobium Josephson junctions, and the superconducting bonds comprise indium. The superconducting critical temperature $T_c$ of Nb is 9.2° K, and that of In is 3.4° K, so that for combined superconducting operation, the MCM must be cooled below 3.4° K.

In a further preferred embodiment, each chip is manufactured with an array of copper posts covered with indium bumps, and the chips are pressed together in such a way that the compression of the indium bumps is stopped by the copper posts, corresponding to a chip separation of order 4microns (μm) (see FIGS. 10-12).

In a still further preferred embodiment, a diffusion stopping layer (DSL) is present to prevent interaction of the indium with the copper or the niobium. This diffusion stopping layer is preferentially also superconducting, so that the conducting path between the chips Nb/DSL/In/DSL/Nb is fully superconducting.

Indium is well known for its unusual mechanical properties; in its pure form, it is a metal with a low melting point, only 157° C., which is somewhat soft and deformable at room temperature, and becomes increasingly softer as the temperature is increased toward the melting point. It is also a highly reactive metal at moderate temperatures, which tends to form alloys with even lower melting points, but these alloys tend to be brittle and less deformable.

The use of indium or indium alloys as low-temperature solders is well known in the prior art. However, the present invention teaches that processing temperatures should be kept less than 150° C., and preferably less than 130° C., to avoid altering the properties of the tunnel barrier that defines the critical current of the Nb Josephson junctions. As such, the indium (or indium alloy) preferably should not reach its melting temperature or liquification point.

In a preferred embodiment, compression is carried out at a temperature of about 75-125° C., whereby the indium is sufficiently soft that pressures of less than several thousand bars (1 bar=14.7 psi=100 kPa) can compress the package in a controlled and reliable manner in a time that is less than one hour, even for an assembly with thousands of bump bonds.

The use of the term "indium" in the present application does not necessarily require 100% purity, but rather that the electrical, thermal, and mechanical properties are substantially the same as those of pure indium. For example, addition of up to 1% of tin into indium goes in substitutionally on the atomic level, and remains soft with a similar melting point, resistivity, and superconducting critical temperature. In contrast, significant oxidation of indium leads to a material that is hard with poor electrical conduction.

A module made in this way is robust and stable, and can withstand thermal cycling and mechanical mounting multiple times between room temperature and an operating temperature of about $_3$ K. The superconducting critical current of a single indium bond of order 10-30 μm in diameter is typically about 10 mA or larger, sufficient to distribute bias currents among Josephson junction circuits. Further, an indium bond can also function to transport signals associated with single-flux-quantum (SFQ) voltage pulses, typically 1 mV high by 2 ps wide. In addition to small (zero) resistance, this also requires that the indium bonds do not have a large inductance (greater than a few pH, consistent with the short interchip spacing), so that these pulses are not substantially dispersed.

Bonding of chips with several thousand indium bonds has been fabricated and tested, showing that this process is scalable to higher levels of integration. This may be particularly valuable for application to a system for quantum computing, as shown conceptually in FIG. 16. One chip could comprise an array of superconducting quantum bits (qubits), while the bonded chip could comprise a matched array of SFQ-based control and readout circuitry. This represents an embodiment of a quantum-classical MCM assembly, comprising, for example, at least one quantum chip and at least one classical chip.

FIGS. 17A-17D show several preferred embodiments of configurations for bonding a quantum circuit (comprising qubits) to a classical circuit (comprising, e.g., SFQ circuits). The circuits from the two chips may be in close contact, or alternatively they may be located on opposite sides of their respective chips. In the latter case, through-chip vias (which may comprise superconducting connections) may provide coupling to the electrical contacts between the chips. Furthermore, high-frequency signal connections between the two chips may be enabled with inductive or capacitive coupling, rather than just direct electrical (galvanic) coupling.

There may be a further advantage for the use of copper posts in the context of quantum circuits. It is known in the literature that when a superconductor (such as niobium or indium) is in good electrical contact with a normal-metal such as copper, hot electrons (also known as excited quasiparticles) may be trapped in the normal metal. This is particularly true at very low temperatures, when the superconducting energy gap is much greater than thermal energy $k_B T$. Such excited quasiparticles may be generated by classical SFQ circuits, which include electrical resistors. It is also known in the literature that such excited quasiparticles may act to reduce the coherence time of qubits, thus limiting their functionality. The presence of copper posts in the electrical contacts between classical and quantum circuits may act to trap excited quasiparticles, thus reducing the leakage of such quasiparticles from the classical to the quantum circuits. This may tend to improve the performance of the quantum circuits, as compared to quantum circuits with bonds that do not include copper posts.

While the intention of preferred embodiments is generally to bond chips together permanently, in an alternative embodiment, the process may be altered slightly so that the two chips may be detached after preliminary testing, without significant damage to either chip. Such an alternative process may comprise slightly reduced temperature, pressure, and/or processing time. Furthermore, detachment (debonding) may be assisted by relatively gentle mechanical means such as a localized burst of high-pressure air, which would also not cause significant damage to the chips.

Further embodiments of the system and method for bonding superconducting chips are presented later in the Detailed Description section, together with a more complete explanation of the figures. These examples represent preferred embodiments of the invention, but the invention is not restricted to these examples, and others embodiments and applications that follow the same principles are also covered.

It is therefore an object to provide a method for interconnecting electronic circuits, comprising: depositing a plurality of metallic posts on each electronic circuit; depositing a respective indium bump on each respective metallic post; aligning the indium bumps of the respective electronic circuits; and applying heat at a temperature below a melting temperature of the indium, and sufficient pressure between the respective electronic circuits, to deform and cold-weld the plurality of aligned indium bumps on the respective electronic circuits, to form a bonded circuit having a plurality of cold-welded indium bonds.

The indium between the aligned metallic posts is plastically deformed and at least a portion is displaced from the space between the tips of the metallic posts. The indium forms a continuous sleeve around the metallic posts between the two electronic circuits. The heat softens the indium, to reduce its resistance to plastic deformation. The amount of compression is limited to avoid cracking of the indium film or undue pressure on the electronic circuits. The compression may continue until the aligned metallic posts contact, and the tips of the metallic posts may be shaped to facilitate such contact. The impedance between respective metallic posts may be measured to determine their contact status.

The heat may be applied at a temperature of between 50° C. and 150° C.

The sufficient pressure may be applied by a fixture configured to maintain the alignment of the indium bumps during application of the sufficient pressure. The fixture may be a flip chip bonder. The method may further comprise removing the bonded circuit from the fixture. The bonded circuit may be cooled to a temperature at which the indium is superconductive.

At least one electronic circuit may comprise a Josephson junction, the method further comprising cooling the at least one electronic circuit, and producing at least one pulse with the Josephson junction.

A diffusion barrier may be deposited under each respective indium bump. The diffusion barrier may comprise a superconducting compound, e.g., niobium nitride or titanium nitride.

The electronic circuits may be fabricated on a wafer, with at least one electronic circuit located on the opposite side of the wafer from the indium bumps. A through-wafer via may be provided which enables electrical connection from the electronic circuit to the indium bumps on the opposite side of the wafer.

The metallic post may comprise copper. Alternates are gold alloy (for hardness), silver, niobium, or other metals. In general, the metallic post should have substantially lower deformation under the compression, so that it remains dimensionally stable.

One of the electronic circuits may comprise a carrier for a multi-chip module. A plurality of electronic circuits may be bonded to the same carrier.

At least one of the electronic circuits may comprise niobium, aluminum, niobium-titanium, or niobium nitride.

At least one of the indium bonds may be electrically connected to a ground layer. The ground layer may be a superconducting ground layer.

At least one indium bump may be about 30 micrometers or less in diameter. For example, it may be 30, 25, 20, 15, 10, or 5 µm in diameter.

The method may further comprise cooling the bonded circuit to a deep cryogenic temperature less than or equal to 3.4° K, e.g., 3.4° K, 3.3° K, 3.2° K, 3.1° K, 3.0° K, 2.75° K, 2.5° K, 2.25° K, 2.0° K, 1.0° K, 0.5° K, 0.25° K, 0.1° K, etc.

The bonded circuit may comprise a superconducting electronic device, and the cold-welded indium bonds may be configured to carry an electrical current without resistance of at least about 10 mA.

At least one of the electronic circuits may comprise at least one qubit. At least one of the electronic circuits may comprise a single-flux-quantum logic circuit. At least one of the electronic circuits may comprise at least one superconducting electromagnetic sensor.

The heating at the temperature below the melting temperature of the indium may comprise heating the aligned bumps to a temperature less than about 150° C., e.g., 150° C., 140° C., 130° C., 120° C., 110° C., 100° C., 90° C., 80° C., 70° C., or 60° C.

The applying a sufficient pressure may comprise applying a uniaxial pressure less than five thousand bars applied across the plurality of bumps for a period of less than one hour. For example, the pressure may be 5000 bars, 4000 bars, 3000 bars, 2500 bars, 2000 bars, 1500 bars, 1200 bars, 1000 bars, or lower. The time of compression may be 100 minutes, 75 minutes, 60 minutes, 45 minutes, 30 minutes, 20 minutes, 15 minutes, 10 minutes, 8 minutes, 5 minutes, 4 minutes, 3 minutes, 2 minutes, or 1 minute.

The alignment of the indium bumps may be achieved using alignment marks in a flip-chip bonder.

The plurality of metallic posts may serve to maintain a uniform separation between the two electronic circuits after compression.

A respective pair of aligned metallic posts may be compressed to displace the indium on top of each respective metallic post.

The number of functional cold-welded indium bonds on at least one electronic circuit may exceed 1000.

The electrical properties of the cold-welded indium bonds may permit the transmission between the electronic circuits of fast pulse trains of picosecond single-flux-quantum voltage pulses below a superconducting temperature of the indium.

The bonded circuits are adapted to be fully debonded without damaging the electronic circuits.

Another object provides a multi-chip module comprising at least two superconducting electronic chips bonded to a superconducting carrier via a plurality of indium bumps, each indium bump comprising an indium coating on a metallic post, wherein opposing indium bumps are compressed and heated below a melting temperature of the indium to form a cold-welded bond that functions as a superconducting interconnect between superconducting circuits on the respective electronic chips and carrier, when cooled to deep cryogenic temperatures. A diffusion barrier layer may be provided between the indium and the metallic post. The cold-welded bond permits the transmission of picosecond single-flux-quantum voltage pulses between the superconducting carrier and a superconducting chip bonded to the carrier.

In order to assist in maintaining the integrity of the cold-welded bonds, a cryogenically stable adhesive, such as an epoxy may be provided in a gap between the electronic circuits.

The module may comprise at least one quantum circuit and at least one classical circuit, wherein the at least one classical circuit functions, e.g., to control the quantum circuit and read out signals from the quantum circuit.

Other objects will become apparent through a review of the description provided herein.

BRIEF DESCRIPTION OF THE DRAWINGS

FIG. 1 shows the deposition of a superconducting ground plane.

FIG. 2 shows the deposition of an insulating layer above the ground plane shown in FIG. 1, with holes through to the ground plane.

FIG. 3 shows the deposition of a superconducting wiring layer on the insulating layer of FIG. 2, forming vias to the ground plane, and a large contact pad.

FIG. 4 shows the deposition of a gold contact pad connecting to the superconducting wiring layer of FIG. 3.

FIG. 5 shows the deposition of copper posts on top of the superconducting vias of FIG. 4.

FIG. 6 shows the deposition of a diffusion stopping layer on top of the copper posts of FIG. 5.

FIG. 7 shows the deposition of indium bumps on top of the diffusion stopping layer of FIG. 6.

DETAILED DESCRIPTION OF THE PREFERRED EMBODIMENTS

FIGS. 1 through 7 show steps of a preferred embodiment of the method for preparing indium bump bonds on superconducting Nb chips, integrated into a prior-art method for fabricating superconducting integrated circuits. All of these are designed to be carried out on an entire 150 mm silicon wafer, although only a 2-mm portion of a single chip is shown for simplicity.

Figure 1:
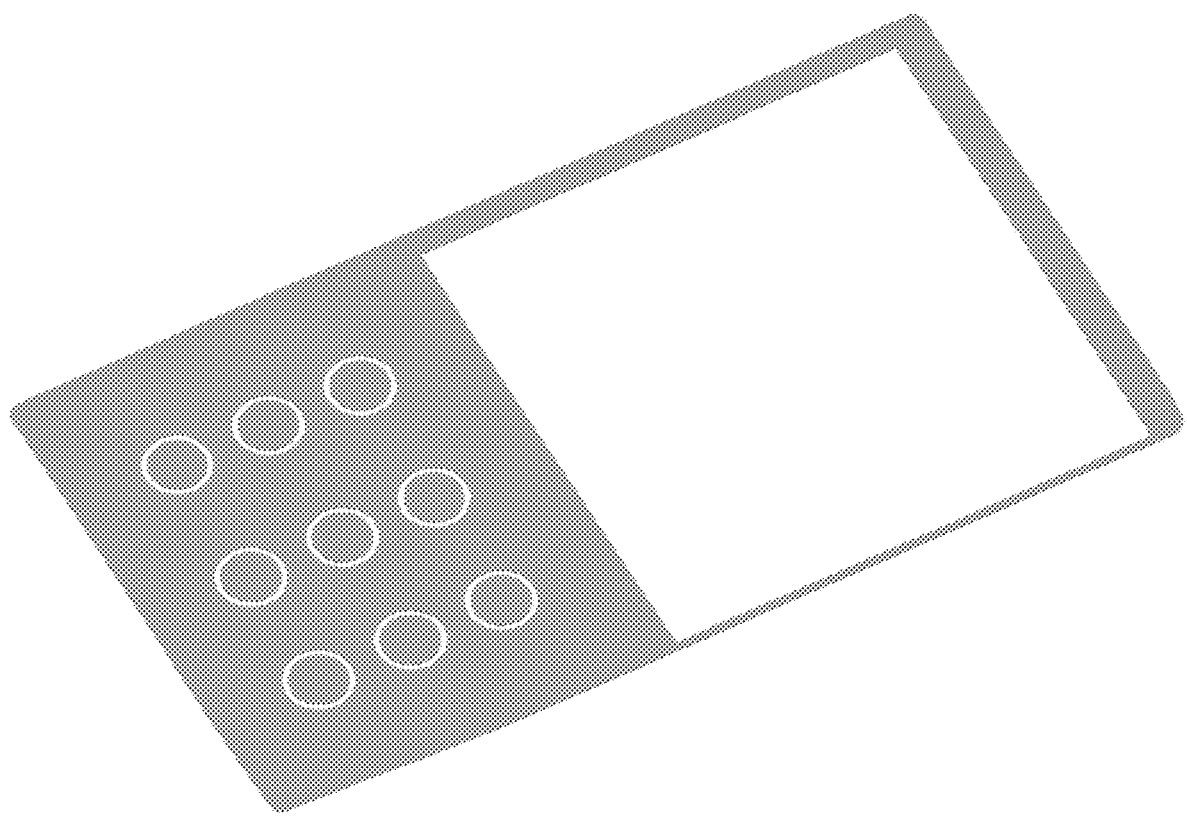
FIGS. 1-7 illustrate a preferred embodiment of the steps to fabricate an array of indium bumps on a superconducting circuit.

FIG. 1 shows Step 1, the deposition of a superconducting Nb ground plane comprising 100 nm of sputtered Nb on top of an oxidized silicon wafer, known in the Hypres standard process (www.hypres.com/foundry/niobium-process/; www.hypres.com/wp-content/uploads/2010/11/Design-Rules-6.pdf; Yohannes, D., et al., "Parametric Testing of HYPRES Superconducting Integrated Circuit Fabrication Processes", IEEE Trans. Applied Superconductivity, V. 17, No. 2, June 2007, pp. 181-186, www.hypres.com/wp-content/uploads/2010/12/Parameter-Testing.pdf) as the layer M0. The small circles show the ultimate locations of the indium bumps, which are not yet present.

Figure 2:
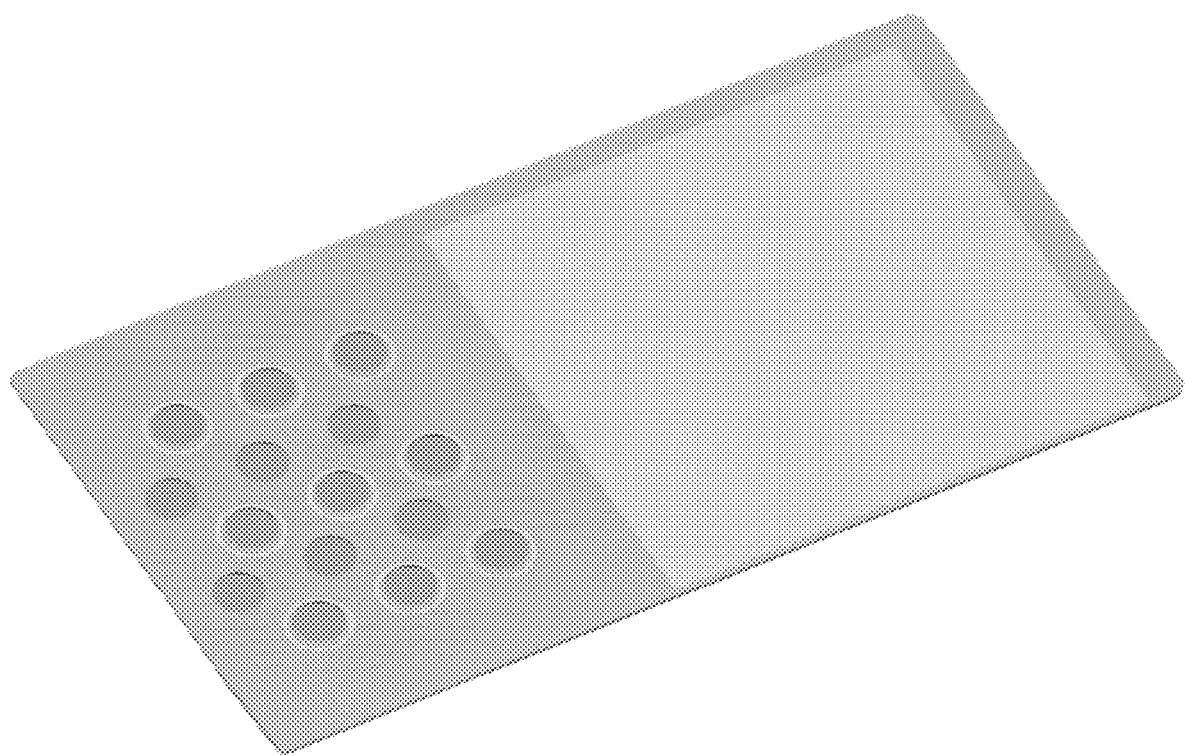

FIG. 2 shows Step 2, the deposition of 150 nm of insulating silicon dioxide ($SiO_2$, typically deposited using plasma-enhanced chemical vapor deposition, or PECVD) on top of the Nb, with an array of patterned holes to establish electrical conducting vias to the next conducting layer. The holes have diameters of about 30 µm or less.

Figure 3:
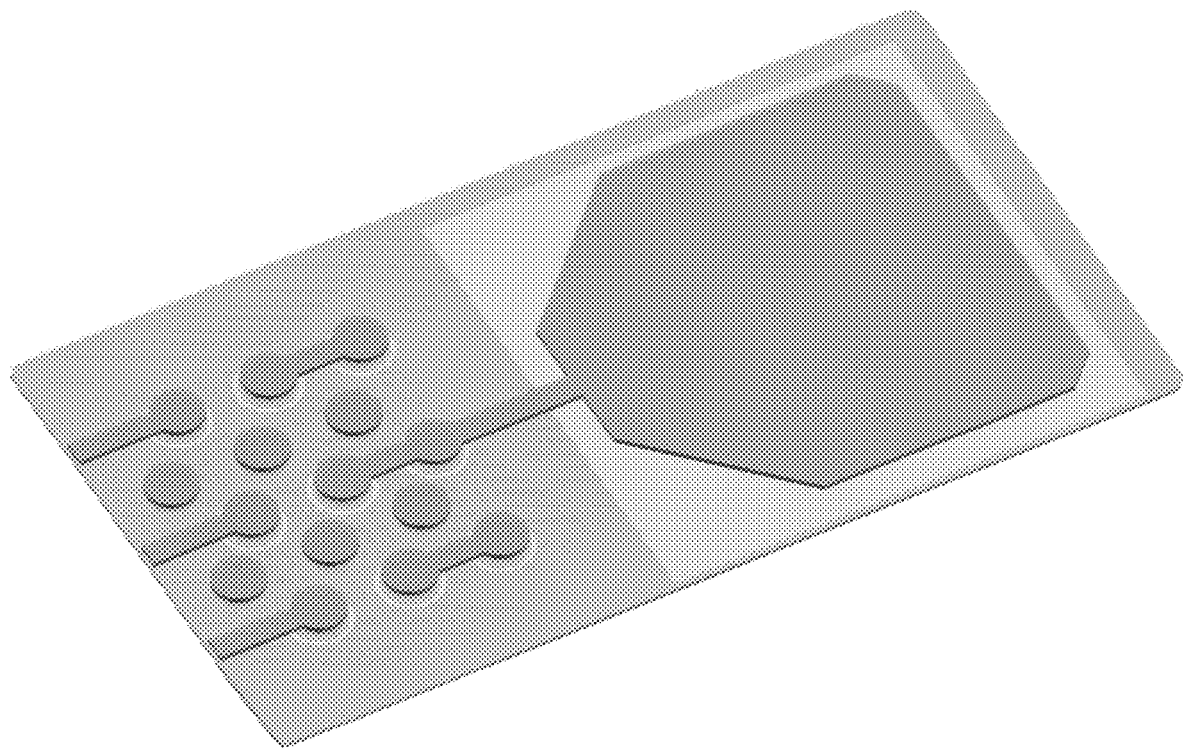

FIG. 3 shows Step 3, the deposition of 300 nm of superconducting Nb that can represent a superconducting signal or a via to ground. Also shown is a large pad on the right that connects to this layer.

Figure 4:
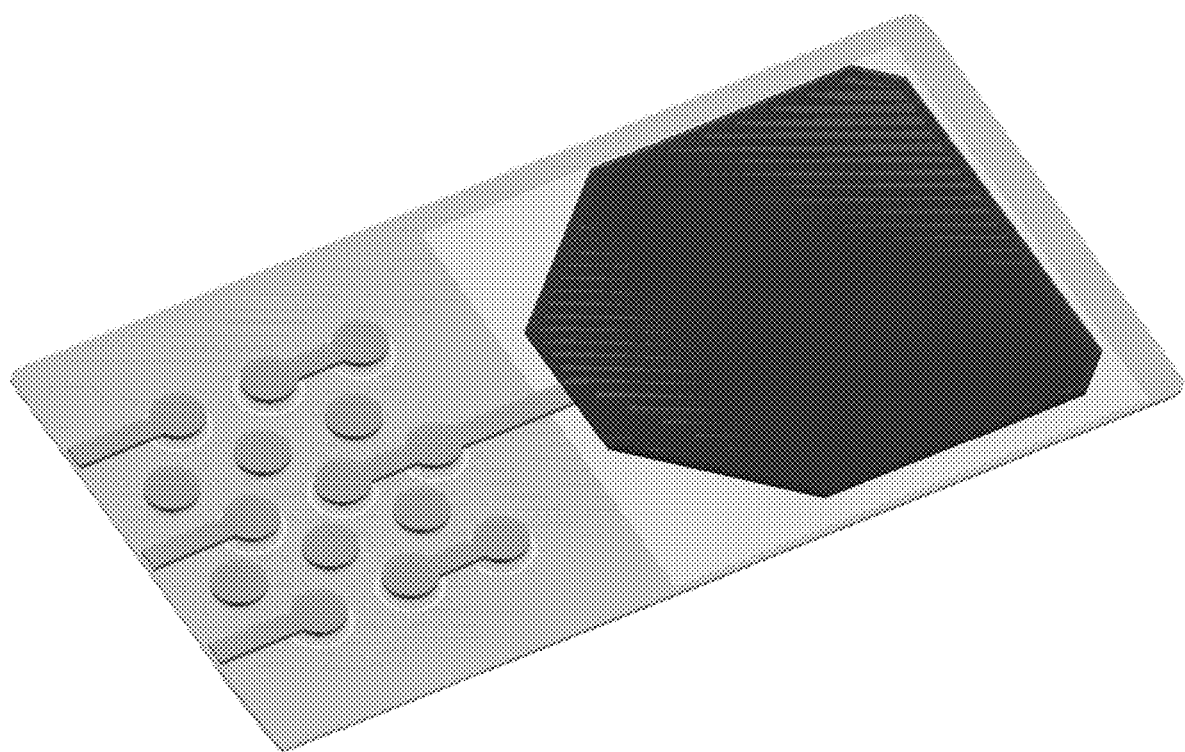

FIG. 4 shows Step 4, the deposition of a large contact pad for external connections, comprising 100 nm Ti and 100 nm Pd followed by 200 nm Au. This establishes a well-adhering pad for external contacts from gold-plated pins.

Steps 1 through 4 comprise steps similar to the fabrication of a prior-art superconducting integrated circuit. Not shown are other standard steps of the prior-art methods, including depositing and defining Josephson junctions of Nb/Al/AlOx/Nb, using controlled oxidation and anodization, depositing a resistive layer such as Mo, additional wiring layers, and steps of planarization. Also, in each case whenever a conducting film is deposited on a sample that has been patterned outside the vacuum system, an initial cleaning step in an argon plasma may be used to ensure unoxidized interfaces.

Figure 5:
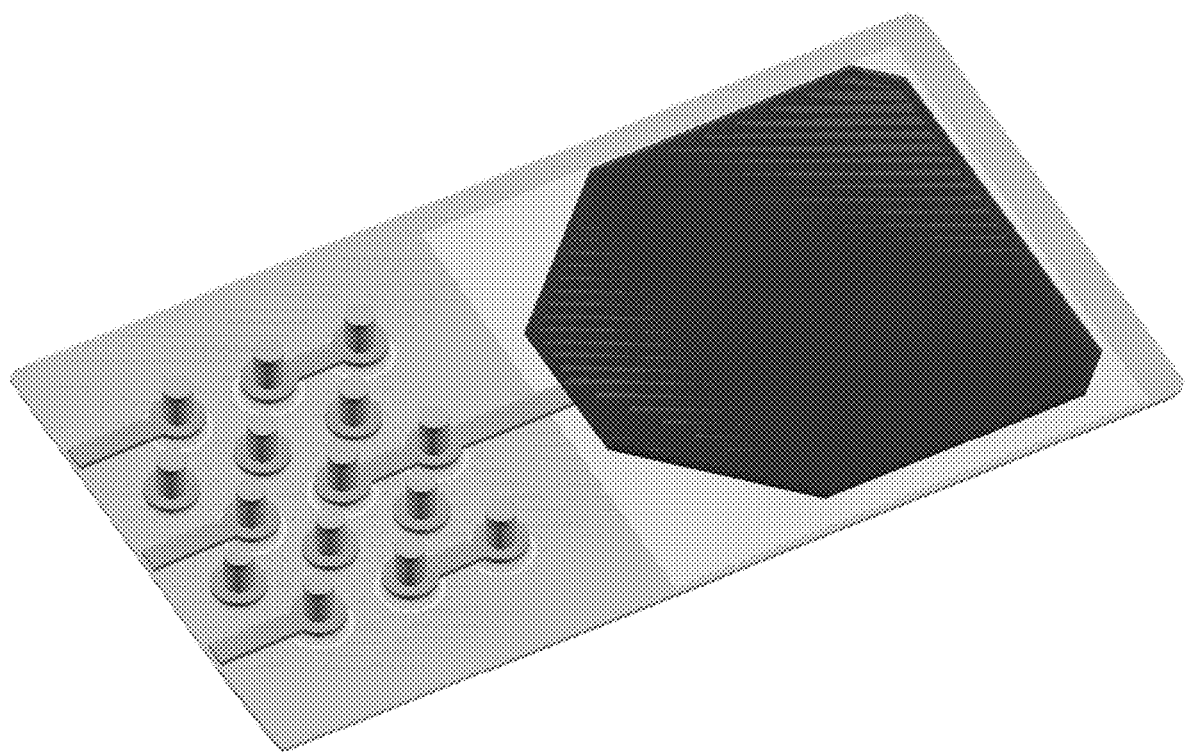

FIG. 5 shows Step 5, the evaporation deposition of an array of 2 µm thick Cu posts on top of the small Nb contacts. Note that the Cu post has a slightly smaller diameter than the Nb contact, leaving a Nb ring around it. These Cu posts can be on ground contacts or signal contacts. The use of Cu is not unique; another metal that is not deformable (or less deformable that the indium under the compression conditions) would also be acceptable, such as Nb, Mo, Ti, Au, etc.

Figure 6:
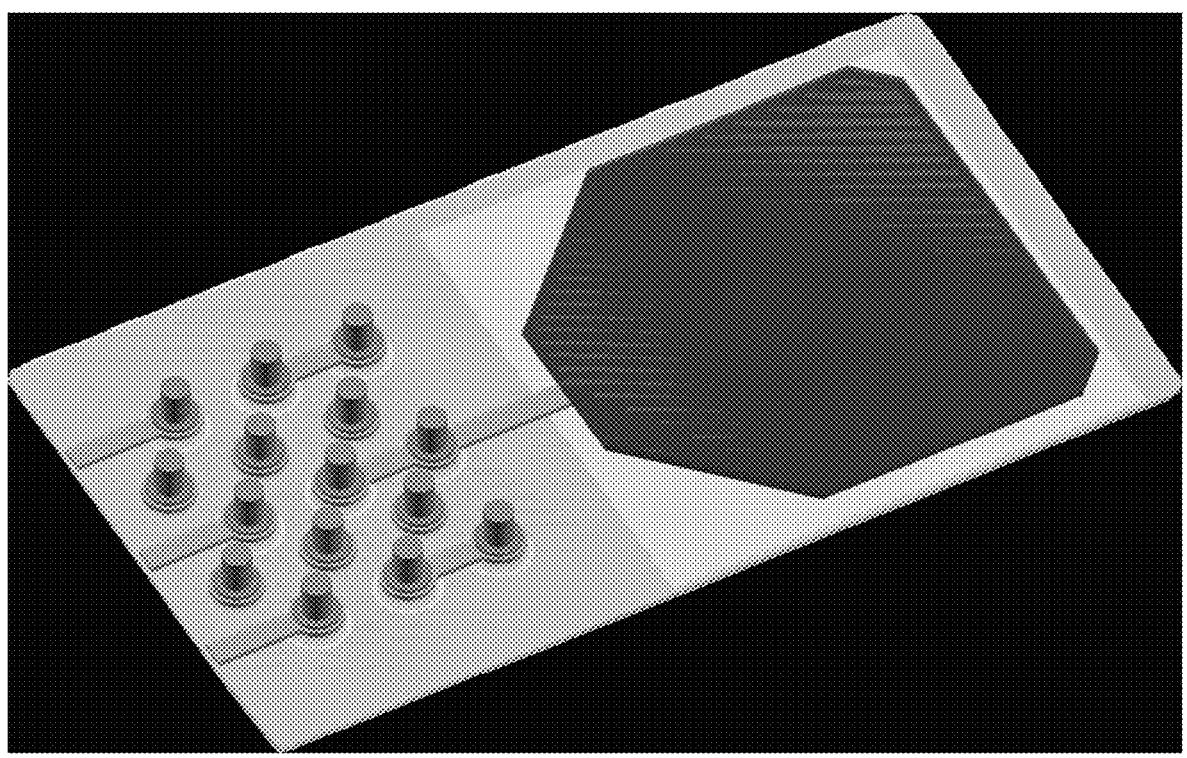

FIG. 6 show Step 6, the deposition of 100 nm of a diffusion stopping layer (DSL) on top of the Cu posts and the Nb ring around each post. Preferred DSL materials include NbN and TiN, both of which can be prepared by reactive sputtering in a gas that includes nitrogen.

Figure 7:
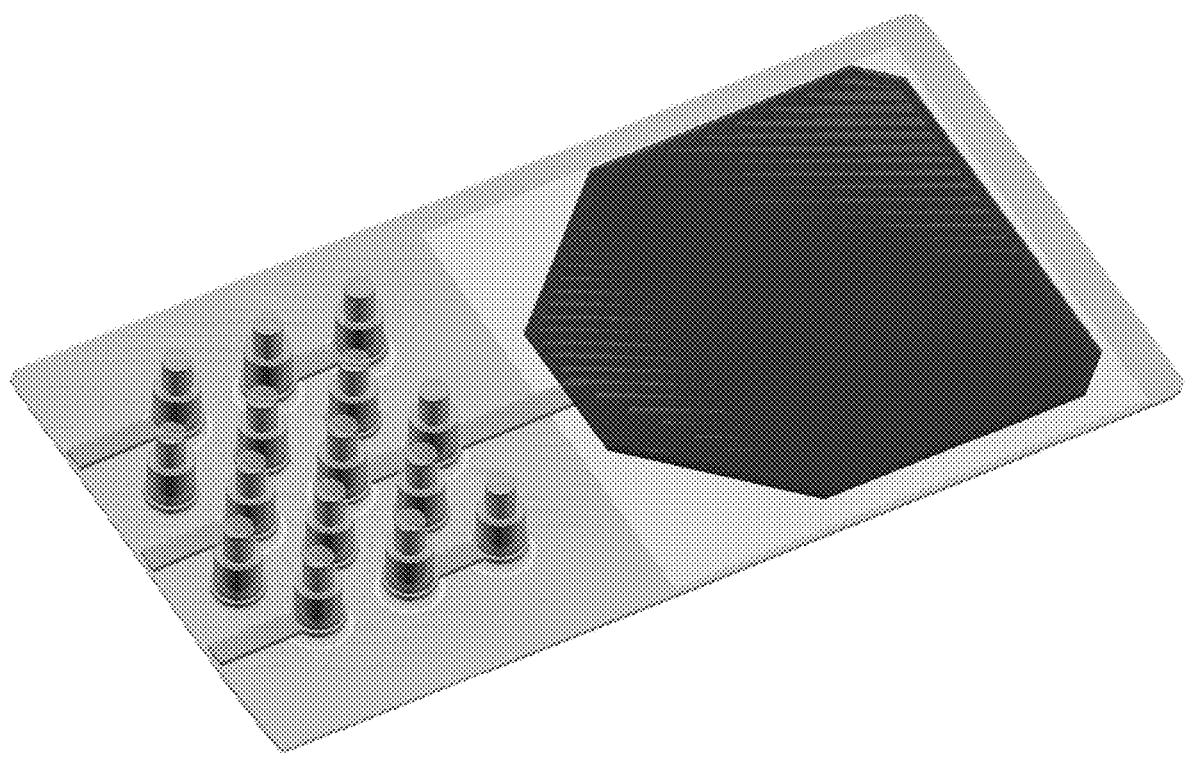

FIG. 7 shows Step 7, the evaporation deposition of 2 µm of indium on top of the DSL. Pure indium is preferred, since indium alloys tend to have a multi-phase microstructure that is harder and more brittle. The metallized patterns may be etched after deposition to form the isolated regions on top of other features.

Figure 8:
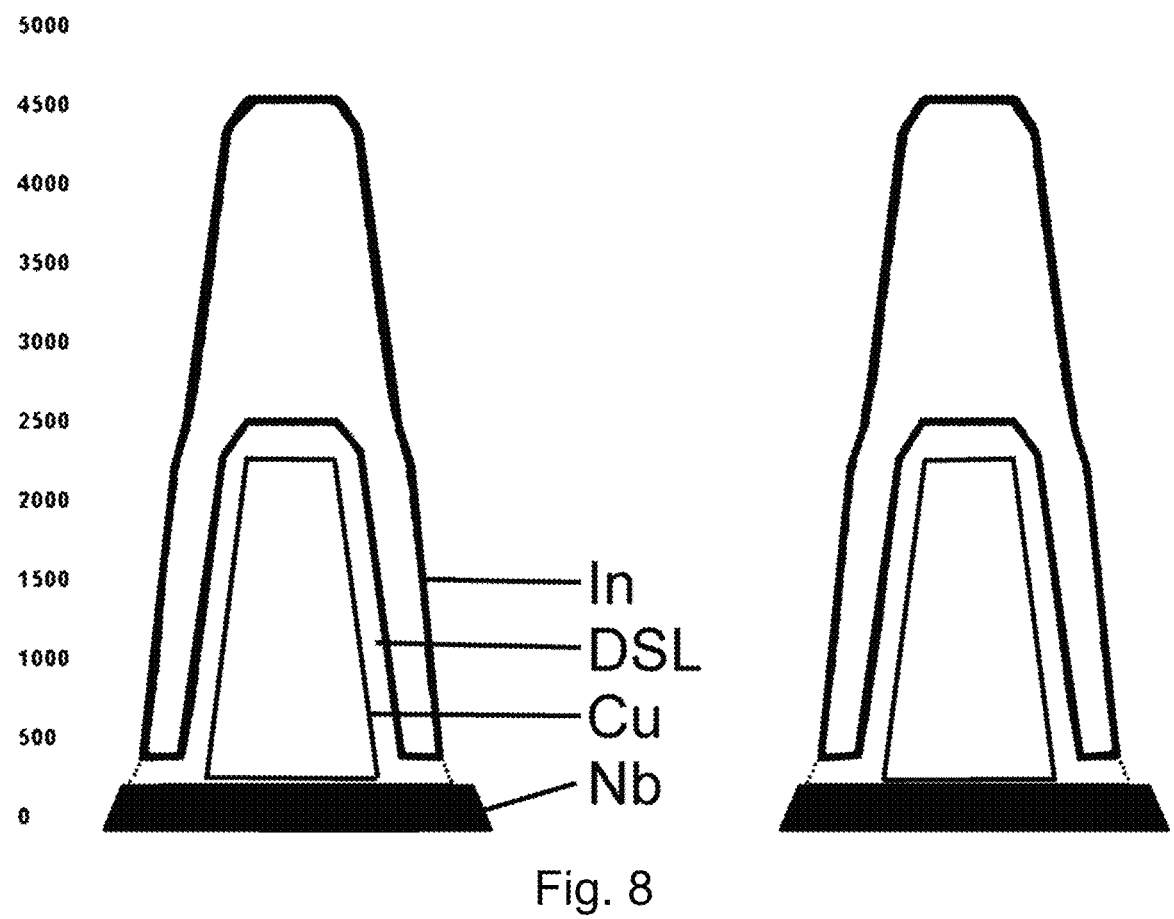
FIG. 8 shows the cross section of two bump bonds before bonding.

FIG. 8 shows the cross section of two of the bumps prepared according to Steps 5 through 7 above, before the chips are pressed together, showing the indium bump, diffusion stopping layer, and copper post on top of the Nb contact. The numbers on the left indicate the approximate layer thicknesses in nm for a preferred embodiment.

Figure 9:
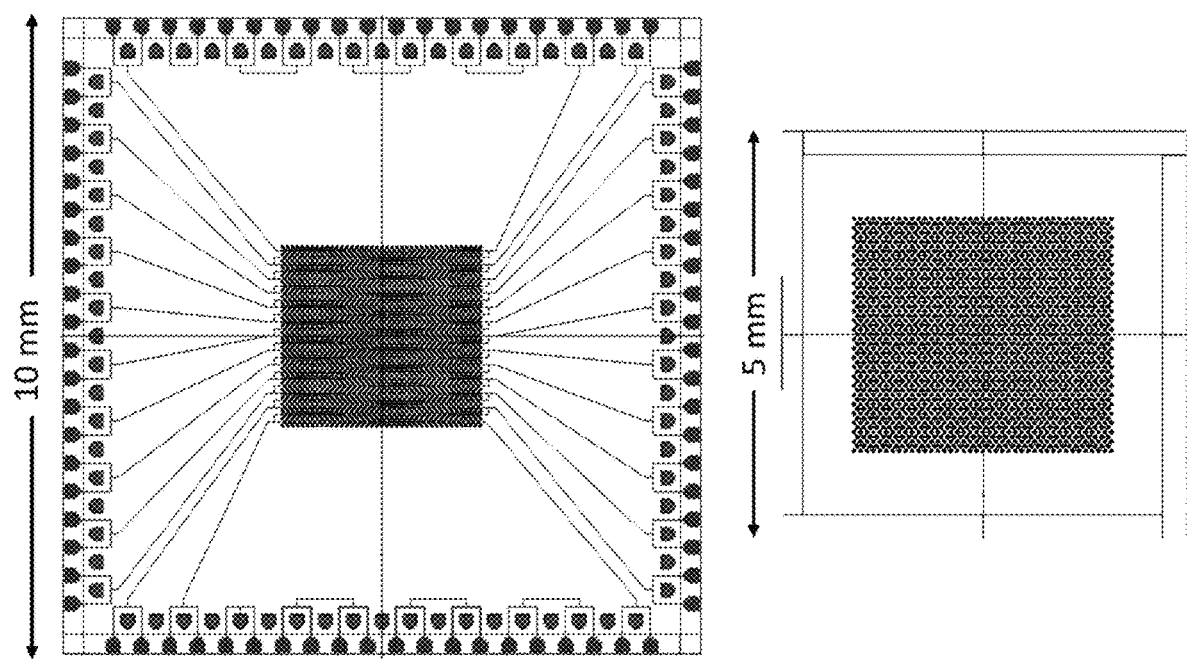
FIG. 9 shows a photograph of a carrier chip and a matching flip chip, each with an array of 2066 bumps.

FIG. 9 shows a photograph of a 10 mm carrier chip and a 5 mm flip chip, each with 2066 bumps, matching on both chips. These bumps comprise 1000 signal bumps (25 rows of 40 bumps each, 30 µm in diameter with 80 µm pitch) alternating with 1066 ground bumps. The carrier chip has gold-plated ground and signal contacts around its periphery, for external biasing and signal measurement. All 1000 signal bumps could be measured at the same time, or any of the 25 rows could be measured independently. Two other similar test structures were also tested using carrier and flip chips of the same size: The first structure had 300 signal bumps (15 rows of 20 bumps each, 30 µm in diameter with 130 µm pitch) alternating with 366 ground bumps, where all signal bumps could be measured together, or with independent rows. The second structure had 2691 signal bumps (39 rows of 69 bumps each, 15 µm in diameter with 50 µm pitch) alternating with 3353 ground bumps.

After removal of the wafer from the deposition system, the individual chips are separated (diced) using a commercial dicing machine. If there will be a significant delay before flip-chip bonding, the chips should be maintained in an environment that minimizes oxidation of the indium surfaces. The presence of significant oxide layers on indium surfaces may reduce the reliability of the method. For example, the chips may be immersed in a bath of methanol. Alternatively, just before bonding, the indium bumps may be subjected to an argon plasma etch to remove an accumulated surface oxide.

Figure 10:
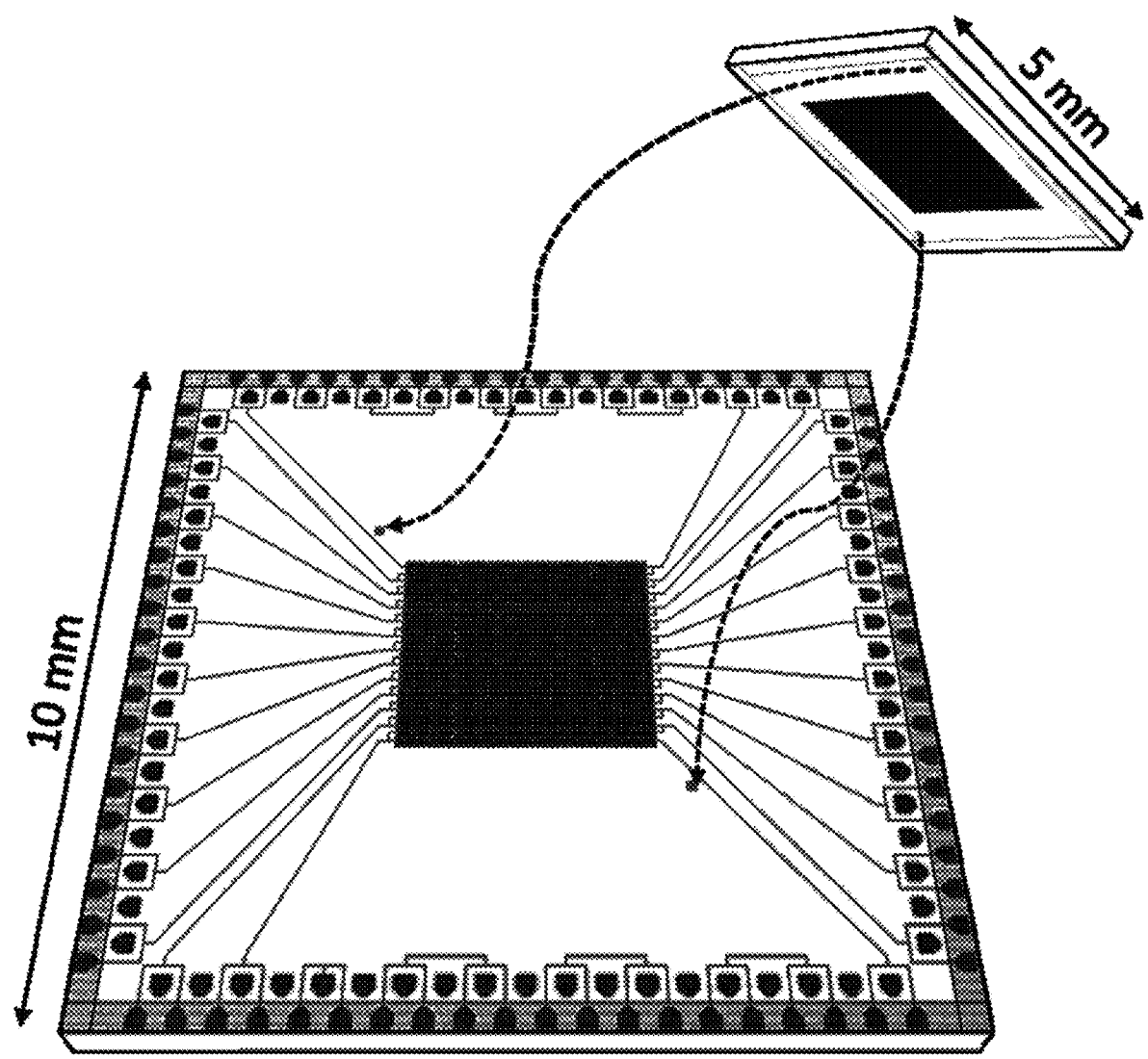
FIG. 10 shows the flip-chip alignment configuration for bonding to the carrier chip.

FIG. 10 shows how the bumps on the flip chip are aligned with the corresponding bumps on the carrier chip, with the help of the small alignment marks noted. This may be carried out using a commercial flip-chip bonder, such as the Karl Suss MicroTec FC-150, which permits micron alignment resolution. This bonder also allows controlled compression and temperature. For each structure, the chips were heated to about 75-125° C., using a force up to 20 kg (i.e., 200 Nt or 44 lb) for a period of about 15 minutes. Given the contact area of the bonds, this force corresponded to a uniaxial pressure up to several thousand bars.

Figure 11:
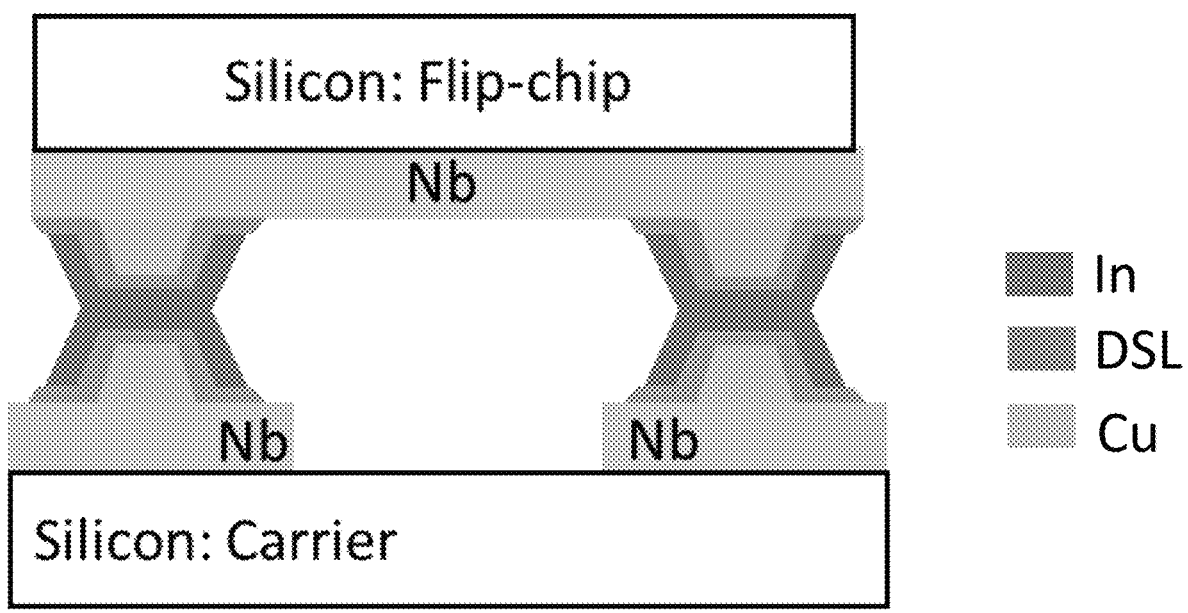
FIG. 11 shows a cross-sectional view of two aligned bonds before full compression.

FIG. 11 provides a cross-sectional view of aligned indium bumps as compression is initiated, with a thick layer of In between the two DSL/copper posts. Thicknesses of layers are not drawn to scale.

Figure 12:
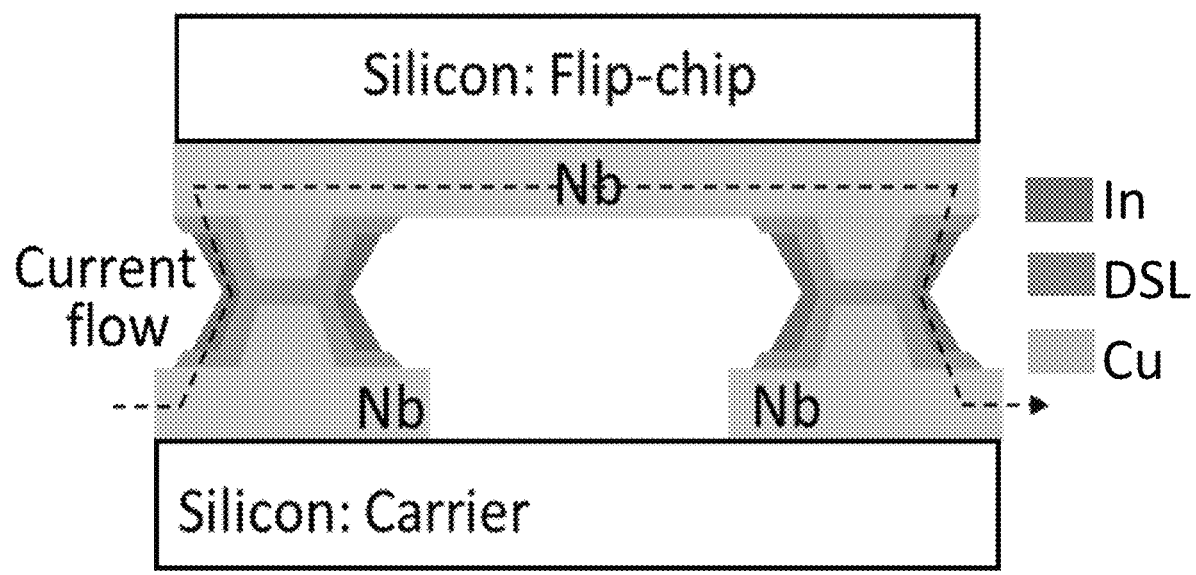
FIG. 12 shows a cross-sectional view of two aligned bonds after full compression.

FIG. 12 provides a cross-section of aligned bumps as compression is completed, with most of the indium between the two DSL/copper posts squeezed out. Since the DSL/Cu is not compressed, this provides a hard stop for the separation of the two chips, about 4 µm for the steps presented. While current can flow through the Cu posts in the resistive state, the superconducting indium shorts out the Cu below 3.4° K, providing a fully superconducting current path. Thicknesses of layers are not drawn to scale.

Figure 13:
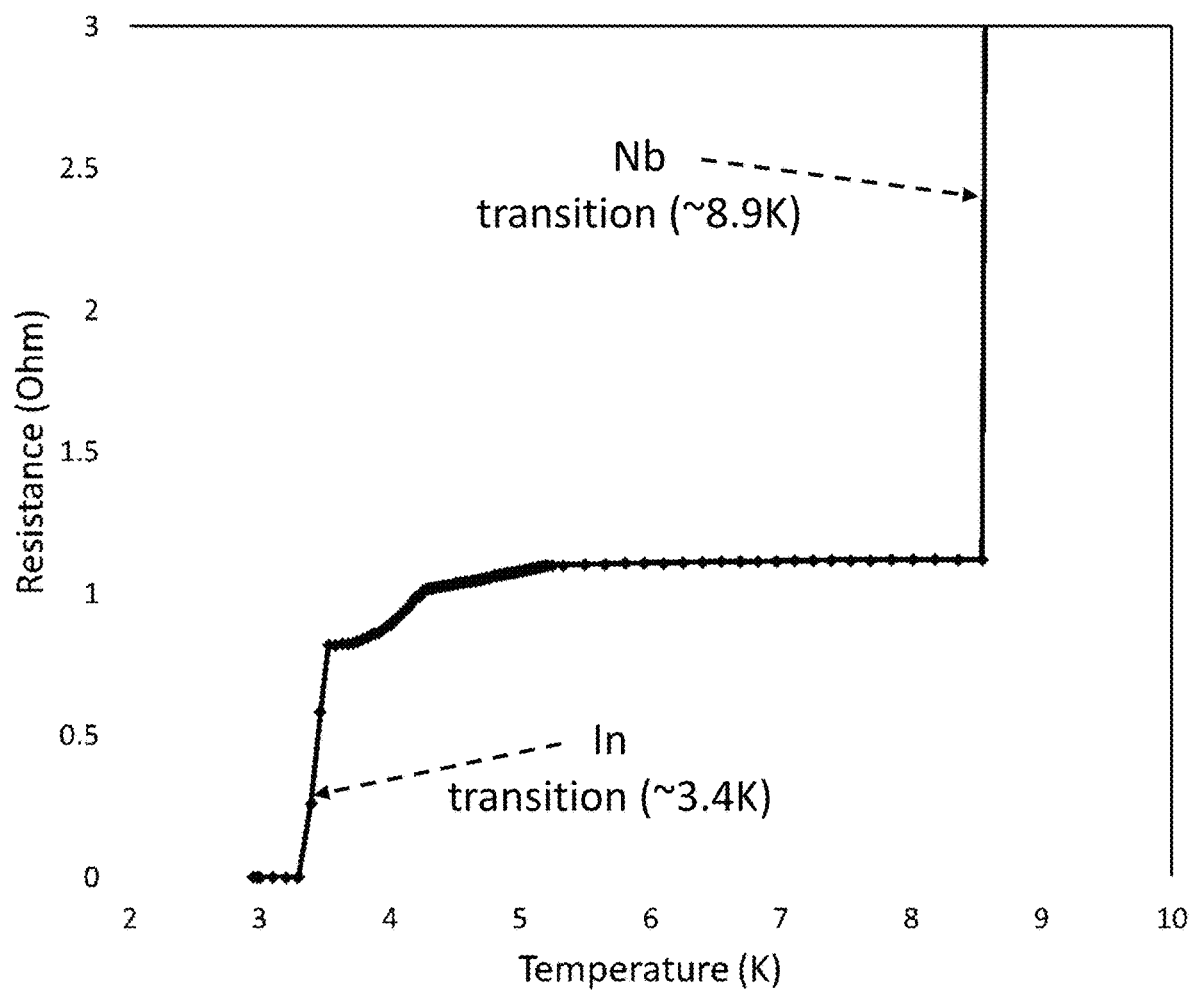
FIG. 13 shows a measurement of the resistance of a series of bonds as a function of cryogenic temperature.

FIG. 13 shows the resistance of a series of In bonds as a function of temperature. The resistance drops sharply when the Nb goes superconducting at 9° K, and drops to zero when the In goes superconducting at 3.4° K.

Figure 14:
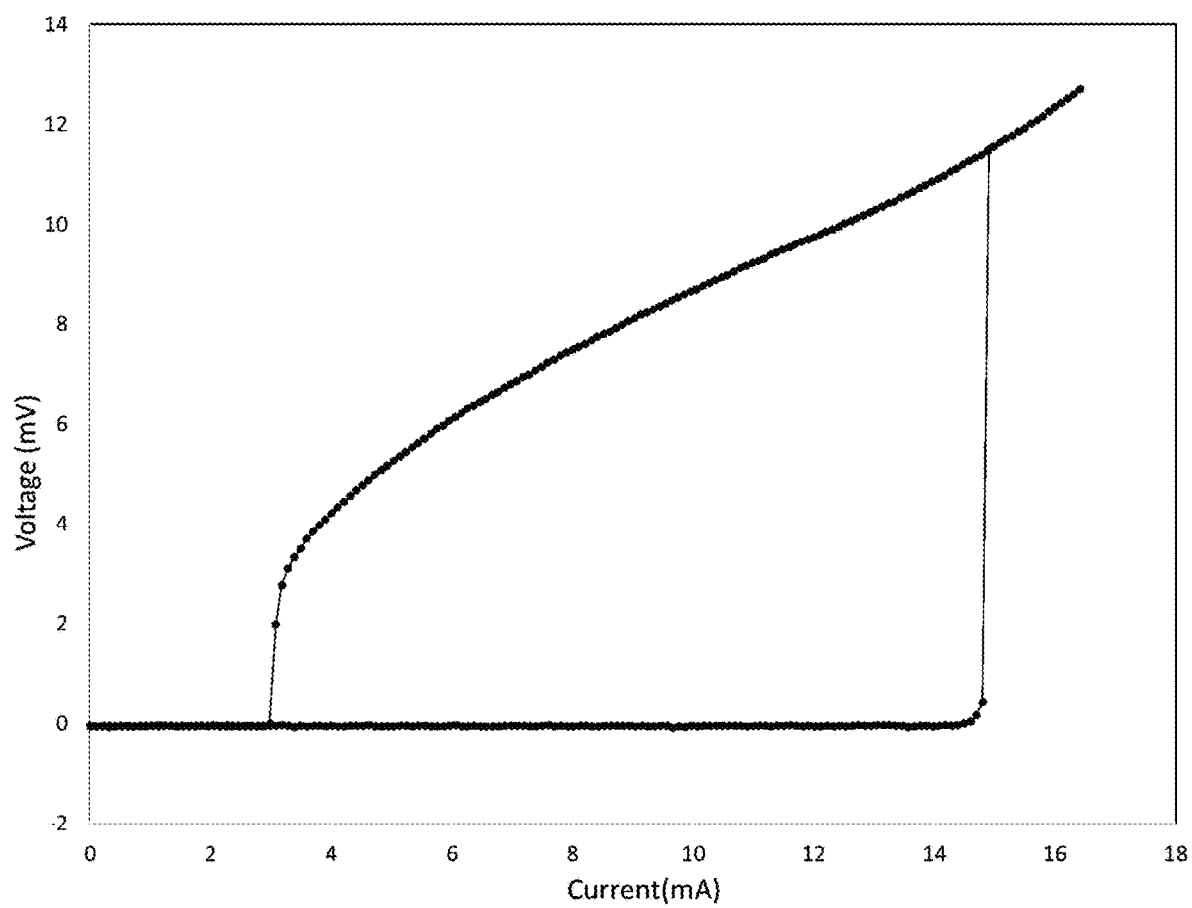
FIG. 14 shows a measurement of V(I) for a series of superconducting indium bonds, showing a large critical current.

FIG. 14 shows the current-voltage curve V(I) for a series of In bonds at 3° K, showing a sharp rise in voltage at the critical current of 15 mA. The large local power dissipation then heats up the In above its critical temperature 3.4° K, until the current is lowered down to 3 mA, when the voltage drops to zero. This sort of hysteresis related to local heating is characteristic of current-driven transitions in superconducting wires.

Figure 15:
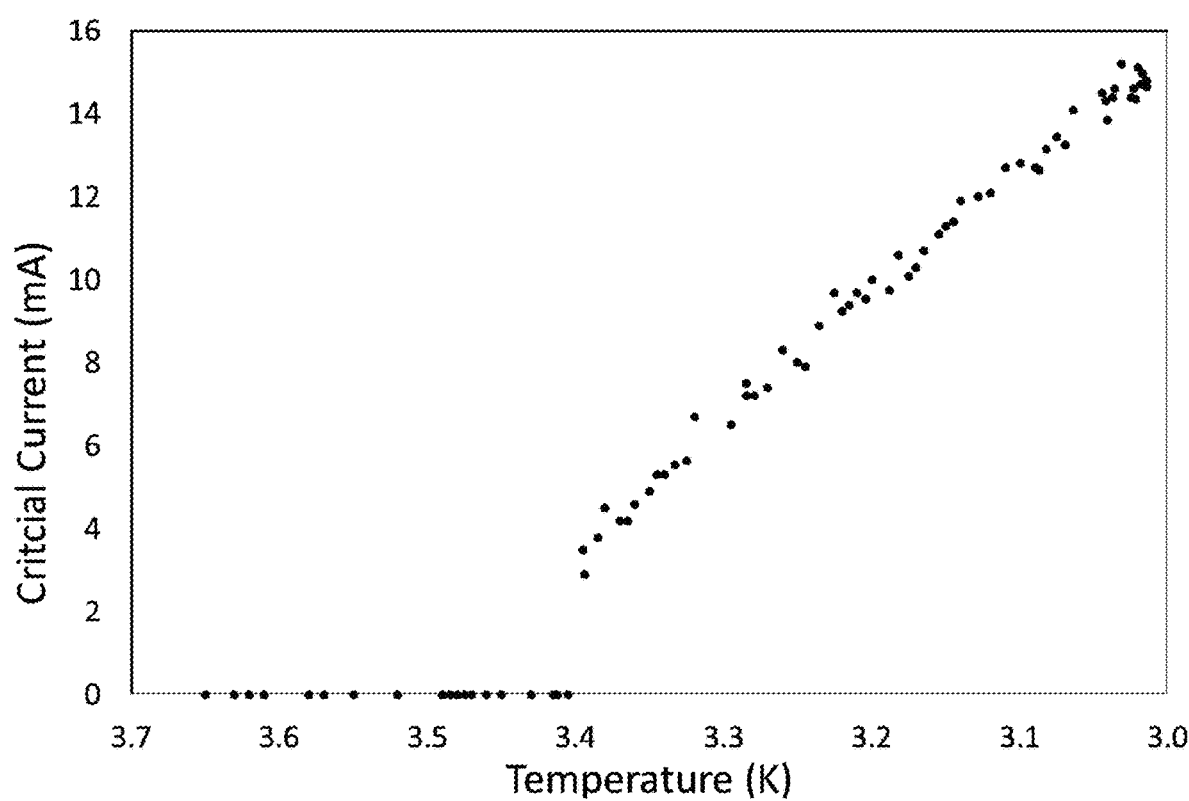
FIG. 15 shows a measurement of the superconducting critical current of a series of bonds as a function of cryogenic temperature.

FIG. 15 shows the critical current of In bonds as a function of temperature below 3.4° K, showing a typical dependence rising as the temperature is cooled further. Any operating temperature at about 3° K or below would be compatible with fully superconducting interconnects.

These tests were carried out for chips mounted on a cryocooler, a cryogenic refrigerator that uses helium as a working fluid, designed to cool down to temperatures as low as 3° K. Even lower temperatures can be achieved if the working fluid comprises the isotope helium-3, especially if the refrigerator is configured as a helium dilution refrigerator, which can achieve temperatures less than 0.1° K.

The tests based on the chips fabricated according to the disclosed optimized processes and parameters demonstrated very high yields on multiple chips, each with thousands of bonds. Further, the results were duplicated with multiple thermal cycles between room temperature and 3° K, indicating robust and reproducible contacts.

Figure 16:
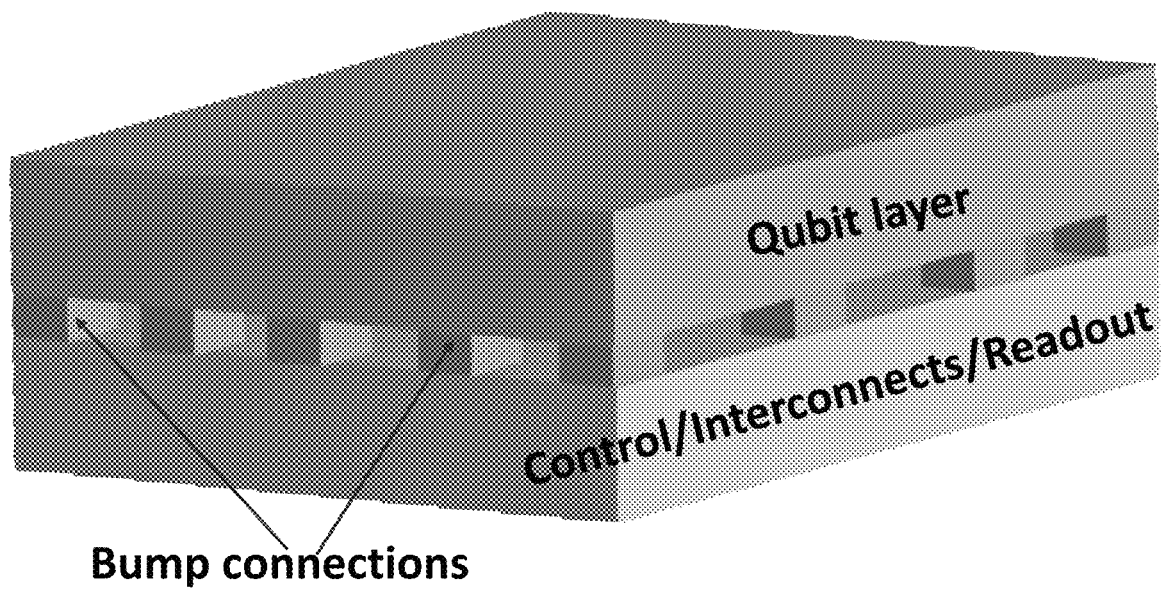
FIG. 16 shows a conceptual picture of a set of two bonded chips for a quantum computing application.

FIG. 16 provides a conceptual picture of a two-chip package, where one chip comprises superconducting quantum bits (qubits), and the other comprises single-flux-quantum control and readout circuits. Each of these chips might be manufactured with a distinct process, as long as both may be combined with indium bump bonds and copper posts. For example, the qubit chip might be prepared using aluminum Josephson junctions and NbTi wiring for transmon qubits, while the control chip might be prepared with Nb Josephson junctions and Nb wiring for energy-efficient SFQ circuits. The entire package could operate at very low temperatures (much less than 1° K) typical of superconducting quantum computing. Further, a three-dimensional quantum computing package need not be limited to two chips. One could also have a multi-chip module comprising a plurality of flip chips on a single carrier.

Figures 17A, 17B:
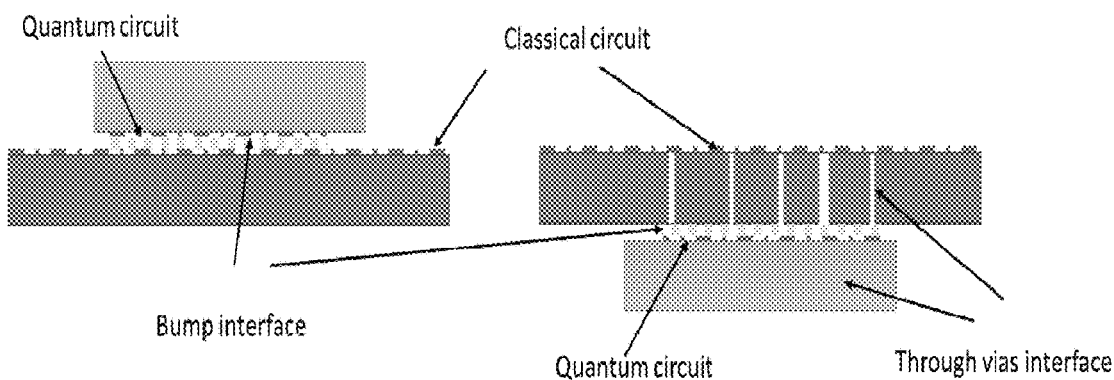
FIGS. 17A-17D show four alternative configurations for bonding a quantum circuit to a classical circuit.

A further set of preferred embodiments for quantum-classical MCMs is illustrated in FIGS. 17A-17D. The simplest of the configurations is shown in FIG. 17A, where the quantum circuits at the bottom of the quantum chip are in close proximity to the classical circuits of the classical chip. There may be a concern that classical SFQ circuits may generate some hot electrons (excited quasiparticles), which may migrate to the quantum circuits and degrade their performance. However, as mentioned above, the presence of the copper posts in the bonds between the classical and quantum circuits may tend to trap at least a significant fraction of the excited quasiparticles, keeping them from contaminating the quantum circuits.

Figures 17C, 17D:
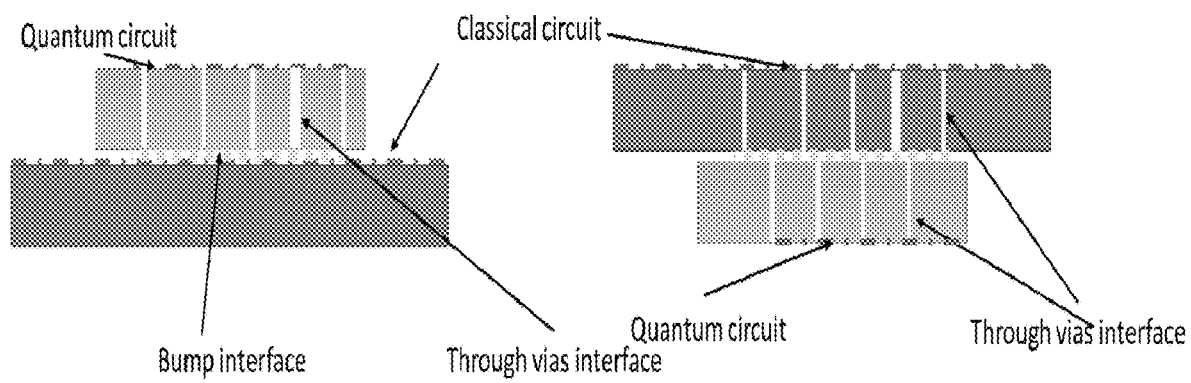

Furthermore, the classical and quantum circuits may be further separated by placing them on opposite sides of the chips, as shown in FIGS. 17B, 17C, and 17D. This would likely reduce further any remaining deleterious effects of the excited quasiparticles. These latter structures may be somewhat more complex to manufacture, requiring etching through-wafer vias, but similar vias are well known in silicon chip manufacturing. These through-wafer vias can be coated with a superconducting film, such as Nb, Al, or In, enabling a superconducting bias current or electrical signal to be transmitted from one side of the chip to the other, without loss or dissipation. Depending on the desired configuration, the through vias may be present in either the classical chip, or the quantum chip, or both. In some cases, it may be desirable to include circuits on both sides of one or more chips.

An alternative application of this packaging technology might be for classical supercomputers, with large numbers of superconducting microprocessors operating in parallel at frequencies of 50-100 GHz. This would also require close integration with cryogenic fast cache memory chips in the same cryogenic environment. One can envision, for example, a set of multi-chip modules, each comprising both cryogenic processors and memory, as well as cryogenic input-output chips that communicate to slower processors and memory at higher temperatures.

A further alternative application of this packaging technology might be for superconducting sensor arrays, which have been demonstrated for magnetic field detection, imaging arrays for astronomy and high-energy physics, and biomedical imaging. Such sensor arrays may further be integrated with superconducting digitizers, digital signal processors, and digital controllers, preferably in the same cryogenic environment as the sensors. This would require a set of multi-chip modules combining sensor chips with digital processing chips.

While superconducting multichip modules and indium bonding have been disclosed in the prior art, the present technology presents a substantial improvement. Much of the prior art focuses on solder reflow at moderately high temperatures, which would alter the precise parameters of the sensitive Josephson junctions on the chips. Other prior art uses unheated cold-welding of indium, which we have found is impractical for scaling to large numbers of bonds, because that would require pressures that are so large as to risk damaging or cracking the chips or substrates. We have found that a good compromise is an intermediate processing temperature about 75-125° C., but preferably less than 150° C., where the indium is somewhat softer, and neither the temperature nor the pressure risks damage to the chips.

Another aspect of the prior art of indium bonding is that diffusion and alloying was favored, because the alloy is harder and achieves a more rigid bond. On the contrary, the present invention attempts to reduce or eliminate diffusion and alloying using a diffusion stopping layer (DSL) between the indium and all other metals. This suppresses the formation of brittle intermetallics that would limit plastic flow of the In around the Cu post. Also, the preferred DSL is also superconducting (such as NbN and TiN), so that it may form a sharp superconducting interface between the In and the Nb.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

What is claimed is:

1. A method for interconnecting electronic circuits, comprising:
    depositing a plurality of metallic posts on each electronic circuit, at least one electronic circuit comprising a superconducting electronic device;
    depositing a respective indium bump on each respective metallic post;
    aligning the indium bumps of the respective electronic circuits; and
    applying heat at a temperature below a melting temperature of the indium, and sufficient pressure between the respective electronic circuits, to deform and cold-weld the plurality of aligned indium bumps on the respective electronic circuits, to form a bonded circuit having a plurality of cold-welded indium bonds configured to carry an electrical current without resistance of at least about 10 mA at a temperature of less than 3.4° K.

2. The method according to claim 1, wherein the heat is applied at a temperature of between 50° C. and 150° C.

3. The method according to claim 1, further comprising cooling the bonded circuit to a temperature at which the indium is superconductive.

4. The method according to claim 1, wherein at least one electronic circuit comprises a Josephson junction, further comprising cooling the at least one electronic circuit, and producing at least one pulse with the Josephson junction.

5. The method of claim 1, further comprising depositing a diffusion barrier under each respective indium bump.

6. The method of claim 5, wherein the diffusion barrier comprises a superconducting compound selected from the group consisting of niobium nitride and titanium nitride.

7. The method of claim 1, wherein the electronic circuits are fabricated on a wafer located on an opposite side of the wafer from the indium bumps, and a through-wafer via enables electrical connection from the electronic circuit to the indium bumps on the opposite side of the wafer.

8. The method of claim 1, wherein the metallic post comprises copper.

9. The method of claim 1, wherein one of the electronic circuits comprises a carrier for a multi-chip module, and a plurality of electronic circuits are bonded to the same carrier.

10. The method of claim 1, wherein at least one of the electronic circuits comprises niobium, aluminum, niobium-titanium, or niobium nitride, further comprising cooling the bonded circuit to a deep cryogenic temperature less than 3.4° K.

11. The method of claim 1, wherein at least one of the indium bonds electrically connects to a superconducting ground layer.

12. The method of claim 1, wherein at least one indium bump is about 30 micrometers or less in diameter.

13. The method of claim 1, wherein at least one of the electronic circuits comprises at least one qubit.

14. The method of claim 1, wherein at least one of the electronic circuits comprises at least one of a single-flux-quantum logic circuit and a superconducting electromagnetic sensor.

15. The method of claim 1, wherein the applying a sufficient pressure comprises applying a uniaxial pressure less than five thousand bars applied across the plurality of bumps for a period of less than one hour.

16. The method of claim 1, wherein a respective pair of aligned metallic posts are compressed to displace the indium on top of each respective metallic post.

17. A multi-chip module comprising at least two superconducting electronic chips bonded to a superconducting carrier via a plurality of indium bumps, each indium bump comprising an indium coating on a metallic post, wherein opposing indium bumps are compressed and heated below a melting temperature of the indium to form a cold-welded bond configured to carry an electrical current without resistance of at least about 10 mA at a temperature of less than 3.4° K, that functions as a superconducting interconnect between superconducting circuits on the respective electronic chips and carrier.

18. The multi-chip module of claim 17, further comprising a diffusion barrier layer between the indium and the metallic post.

19. The multi-chip module of claim 17, wherein the cold-welded bond permits the transmission of picosecond single-flux-quantum voltage pulses between the superconducting carrier and a superconducting chip bonded to the carrier.

20. The multi-chip module of claim 17, wherein the module comprises at least one quantum circuit and at least one classical circuit, wherein the at least one classical circuit functions to control the quantum circuit and read out signals from the quantum circuit.

21. A method for interconnecting electronic circuits, comprising:
    providing a superconducting electronic circuit and an electronic substrate, each having a plurality of metallic posts with an indium bump on each of the plurality of metallic posts;
    aligning the indium bumps of the superconducting electronic circuit with the indium bumps of the electronic substrate; and heating the aligned indium bumps below a melting temperature of the indium, under sufficient pressure to deform and cold-weld the plurality of aligned indium bumps, to form a bonded circuit having a plurality of cold-welded indium bonds configured to carry an electrical current without resistance of at least about 10 mA at a temperature of less than 3.4° K.

\* \* \* \* \*